(12) United States Patent
Herron et al.

(10) Patent No.: US 8,273,468 B2
(45) Date of Patent: Sep. 25, 2012

(54) GREEN LUMINESCENT MATERIALS

(75) Inventors: Norman Herron, Newark, DE (US); Mark A. Guidry, Wilmington, DE (US); Vsevolod Rostovtsev, Swarthmore, PA (US); Jeffrey A. Merlo, Wilmington, DE (US); Kalindi Dogra, Wilmington, DE (US); Victoria J. North, Newark, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/085,574

(22) Filed: Apr. 13, 2011

(65) Prior Publication Data

US 2011/0186836 A1    Aug. 4, 2011

Related U.S. Application Data

(63) Continuation of application No. 12/129,770, filed on May 30, 2008.

(60) Provisional application No. 60/941,380, filed on Jun. 1, 2007.

(51) Int. Cl.
*H01L 51/50* (2006.01)

(52) U.S. Cl. ............... 428/690; 428/917; 257/E51.05; 257/E51.026; 257/E51.032; 313/504; 313/505; 313/506; 564/426; 564/434

(58) Field of Classification Search ............... 428/690, 428/917; 257/40, E51.05, E51.026, 51.032; 313/504, 505, 506; 564/426, 434
See application file for complete search history.

(56) References Cited

U.S. PATENT DOCUMENTS

| | | | |
|---|---|---|---|
| 4,053,311 A | 10/1977 | Limburg et al. | |
| 5,247,190 A | 9/1993 | Friend et al. | |
| 5,378,519 A | 1/1995 | Kikuchi et al. | |
| 5,408,109 A | 4/1995 | Heeger et al. | |
| 6,303,238 B1 | 10/2001 | Thompson et al. | |
| 6,670,645 B2 | 12/2003 | Grushin et al. | |
| 6,852,429 B1 | 2/2005 | Li et al. | |
| 6,875,524 B2 | 4/2005 | Hatwar et al. | |
| 7,075,102 B2 | 7/2006 | Grushin et al. | |
| 7,173,131 B2 | 2/2007 | Saitoh et al. | |
| 7,358,409 B2 | 4/2008 | Saitoh et al. | |
| 7,375,250 B2 | 5/2008 | Saitoh et al. | |
| 7,402,681 B2 | 7/2008 | Ong et al. | |
| 7,491,450 B2 | 2/2009 | Okinaka et al. | |
| 7,651,788 B2 | 1/2010 | Seo et al. | |
| 7,709,104 B2 | 5/2010 | Saitoh et al. | |
| 2002/0076576 A1 | 6/2002 | Li | |
| 2003/0072966 A1 | 4/2003 | Hosokawa et al. | |
| 2003/0138657 A1 | 7/2003 | Li | |
| 2004/0102577 A1 | 5/2004 | Hsu et al. | 252/182 |
| 2004/0106003 A1 | 6/2004 | Chen et al. | |
| 2004/0121184 A1 | 6/2004 | Thompson et al. | |
| 2004/0127637 A1 | 7/2004 | Hsu et al. | 524/800 |
| 2004/0209118 A1 | 10/2004 | Seo et al. | |
| 2004/0263067 A1 | 12/2004 | Saitoh et al. | |
| 2005/0031898 A1 | 2/2005 | Li et al. | |
| 2005/0064233 A1 | 3/2005 | Matsuura et al. | |
| 2005/0158577 A1 | 7/2005 | Ishibashi et al. | |
| 2005/0184287 A1 | 8/2005 | Herron et al. | 257/40 |
| 2005/0205860 A1 | 9/2005 | Hsu et al. | 257/40 |
| 2005/0244670 A1 | 11/2005 | Saitoh et al. | |
| 2005/0245752 A1 | 11/2005 | Conley et al. | 552/271 |
| 2006/0033421 A1 | 2/2006 | Matsuura et al. | |
| 2006/0043858 A1 | 3/2006 | Ikeda et al. | |
| 2006/0052641 A1 | 3/2006 | Funahashi | |
| 2006/0103298 A1 | 5/2006 | Lee | |
| 2006/0113528 A1 | 6/2006 | Okinaka et al. | |
| 2006/0115678 A1 | 6/2006 | Saitoh et al. | |
| 2006/0121312 A1 | 6/2006 | Yamada et al. | |
| 2006/0127698 A1* | 6/2006 | Tokailin et al. | 428/690 |
| 2006/0152146 A1 | 7/2006 | Funahashi | |
| 2006/0158102 A1 | 7/2006 | Kawamura et al. | 313/504 |
| 2006/0159838 A1 | 7/2006 | Kowalski et al. | |
| 2006/0194074 A1 | 8/2006 | Funahashi | |
| 2006/0210830 A1 | 9/2006 | Funahashi | |
| 2006/0217572 A1 | 9/2006 | Kawamura et al. | 564/427 |
| 2006/0267488 A1 | 11/2006 | Saitoh et al. | |
| 2006/0284140 A1 | 12/2006 | Breuning et al. | |
| 2007/0031701 A1 | 2/2007 | Nakashima et al. | |
| 2007/0063638 A1 | 3/2007 | Tokairin et al. | |
| 2007/0114917 A1 | 5/2007 | Funahashi | |
| 2007/0155991 A1 | 7/2007 | Funahashi | |
| 2007/0236137 A1 | 10/2007 | Funahashi | |
| 2007/0247063 A1 | 10/2007 | Murase et al. | |
| 2007/0255076 A1 | 11/2007 | Ito et al. | |
| 2007/0292713 A9 | 12/2007 | Dobbs et al. | |
| 2007/0298530 A1 | 12/2007 | Feehery | |

| | | | |
|---|---|---|---|
| 2008/0049413 A1 | 2/2008 | Jinde et al. | |
| 2008/0071049 A1 | 3/2008 | Radu et al. | |
| 2008/0086012 A1 | 4/2008 | Egawa et al. | |
| 2008/0114178 A1 | 5/2008 | Kawakami et al. | |
| 2008/0191614 A1 | 8/2008 | Kim et al. | |
| 2008/0233433 A1 | 9/2008 | Igarashi et al. | |
| 2008/0286605 A1 | 11/2008 | Takeda | |
| 2008/0303425 A1 | 12/2008 | Rostovtsev et al. | |
| 2008/0303428 A1 | 12/2008 | Rostovtsev et al. | |
| 2008/0315754 A1 | 12/2008 | Kawamura et al. | |
| 2009/0058279 A1 | 3/2009 | Takeda | |
| 2009/0134781 A1 | 5/2009 | Jang et al. | |
| 2011/0147718 A1 | 6/2011 | Howard, Jr. et al. | |

FOREIGN PATENT DOCUMENTS

| | | |
|---|---|---|
| EP | 443861 A2 | 7/1995 |
| EP | 0 765 106 A2 | 3/1997 |
| EP | 1061112 A1 | 12/2000 |
| EP | 1317005 A2 | 6/2003 |
| EP | 1 541 657 A1 | 6/2005 |
| EP | 1561794 A1 | 8/2005 |
| EP | 1 612 202 A1 | 1/2006 |
| EP | 2067766 A1 | 6/2009 |
| EP | 2067767 A1 | 6/2009 |
| EP | 2093271 A1 | 8/2009 |
| JP | 07249490 A | 9/1995 |
| JP | 08053397 A | 2/1996 |
| JP | 2004010550 A | 1/2004 |
| JP | 2006016384 A | 1/2006 |
| JP | 2006052323 A | 2/2006 |
| JP | 2006151844 A | 6/2006 |
| JP | 2006219392 A | 8/2006 |
| JP | 2007186449 A | 7/2007 |
| JP | 2009161470 A | 7/2009 |
| KR | 1020090046731 A | 5/2009 |
| KR | 1020090086015 A | 8/2009 |
| KR | 1020090086920 A | 8/2009 |
| KR | 1020090093897 A | 9/2009 |
| WO | 0070655 A2 | 11/2000 |
| WO | 0141512 A1 | 6/2001 |
| WO | 03008424 A1 | 1/2003 |
| WO | 03040257 A1 | 5/2003 |
| WO | 03063555 A1 | 7/2003 |
| WO | 03091688 A2 | 11/2003 |
| WO | 2004016710 A1 | 2/2004 |
| WO | 2004018587 A1 | 3/2004 |
| WO | 2005000787 A1 | 1/2005 |
| WO | 2005049546 A1 | 6/2005 |
| WO | WO 2005/052027 A1 | 6/2005 |
| WO | 2006025273 A1 | 3/2006 |
| WO | 2007100096 A1 | 9/2007 |
| WO | 2007105917 A1 | 9/2007 |
| WO | 2007108666 A1 | 9/2007 |
| WO | 2008149968 A1 | 12/2008 |
| WO | 2009018009 A1 | 2/2009 |
| WO | 2009028902 A2 | 3/2009 |
| WO | 2009055628 A1 | 4/2009 |
| WO | 2009067419 A1 | 5/2009 |
| WO | 2010099534 A2 | 9/2010 |
| WO | 2010135403 A2 | 11/2010 |

OTHER PUBLICATIONS

CRC Handbook of Chemistry and Physics, 81$^{st}$ Edition, 2000 (book not included).
G. Gustafsson et al., Flexible Light-Emitting Diodes Made From Soluble Conducting Polymers, Nature, 1992, 357:477-479.
Y Wang, Photoconductive Polymers, Kirk-Othmer Encyclopedia of Chemical Technology, 4$^{th}$ Edition, 1996, 18:837-860.
G. Klaärner et al., Cross-Linkable Polymers Based on Dialkylfluorenes, Chemistry of Materials, 1999, 11:1800-1805.
Written Opinion of the International Searching Authority, PCT/US2008/065022, Apr. 23, 2010, (PCT counterpart of the present application).
Carey et al., Structure and Mechanisms; Advanced Organic Chemistry, Part A, 5th Edition, pp. 142-145.
Danel et al—Blue-Emitting Anthracenes With End-Capping Diaryamines—Chem Mater 2002 vol. 14 pp. 3860-3865.
Marcus—Electronics and Nucleonics Dictionary 470 and 476 (McGraw-Hill).
Mueller et al, Synthesis and Characterization of Soluble Oligo(9,10-anthrylene)s, K. Chem. Ber. 1994, vol. 127, pp. 437-444.
Weine et al—Reactions of an O-Quinone Monoimide With Antracenes, Phencyclone and 1,3-Diphenylisobenzofuran, Journal of Organic Chemistry 1989 vol. 54 pp. 5926-5930.
PCT International Search Report for International Application No. PCT/US2008/065189; D Voyiazoglou Authorized Officer; Oct. 10, 2008.
PCT International Search Report for International Application No. PCT/US2009/068916; Hyun Shik Oh Authorized Officer; Aug. 5, 2010.
PCT International Search Report for International Application No. PCT/US2009/068928; Hyun Shik Oh, Authorized Officer, Aug. 17, 2010.
PCT International Search Report for International Application No. PCT/US2008/065022; P. Delaporte, Authorized Officer, Apr. 23, 2010.
Beckmann et al., "Methyl Reorientation in Solid 3-ethychrysene and 3-isopropylesene; Solid State Nuclear Magnetic Resonance," 1998; vol. 12; pp. 251-256.
Kim et al., "Synthesis and Electroluminescent Properties of Highly Efficient Anthracene Derivatives with Bulky Side Groups," Organic Electronics, 2009, vol. 10, No. 5, pp. 822-833.
Kodomari et al., "Selective Halogenation o f Aromatic Hydrocarbons with Alumina-Supported Copper (III) Halides," Journal of Organic Chemistry, 1988, vol. 53, p. 2093-2094.
Negishi et al; III.2.15 Palladium Catalyzed Conjugate Substitution; Handbook of Organopalladium Chemistry for Organic Synthesis, 2000, vol. 1, pp. 767-789.
International Search Report for Application No. PCT/US2011/064654, published as WO2012/082743; Jan Ziegler, Authorized Officer; EPO; May 31, 2012.

* cited by examiner

*Primary Examiner* — Jennifer Chriss
*Assistant Examiner* — Gregory Clark

(57) ABSTRACT

There is provided a green luminescent material having Formula I or Formula II

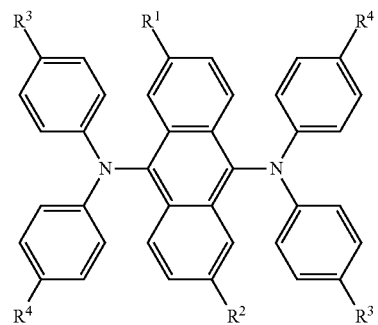

Formula I

Formula II $R^1$ and $R^2$ can be the same or different and can be hydrogen, alkoxy, tertiary alkyl, or cycloalkyl. $R^3$ and $R^4$ are the same or different and can be fluorine, aryl, or alkyl. There is also provided an organic electronic device containing the green luminescent material.

13 Claims, 1 Drawing Sheet

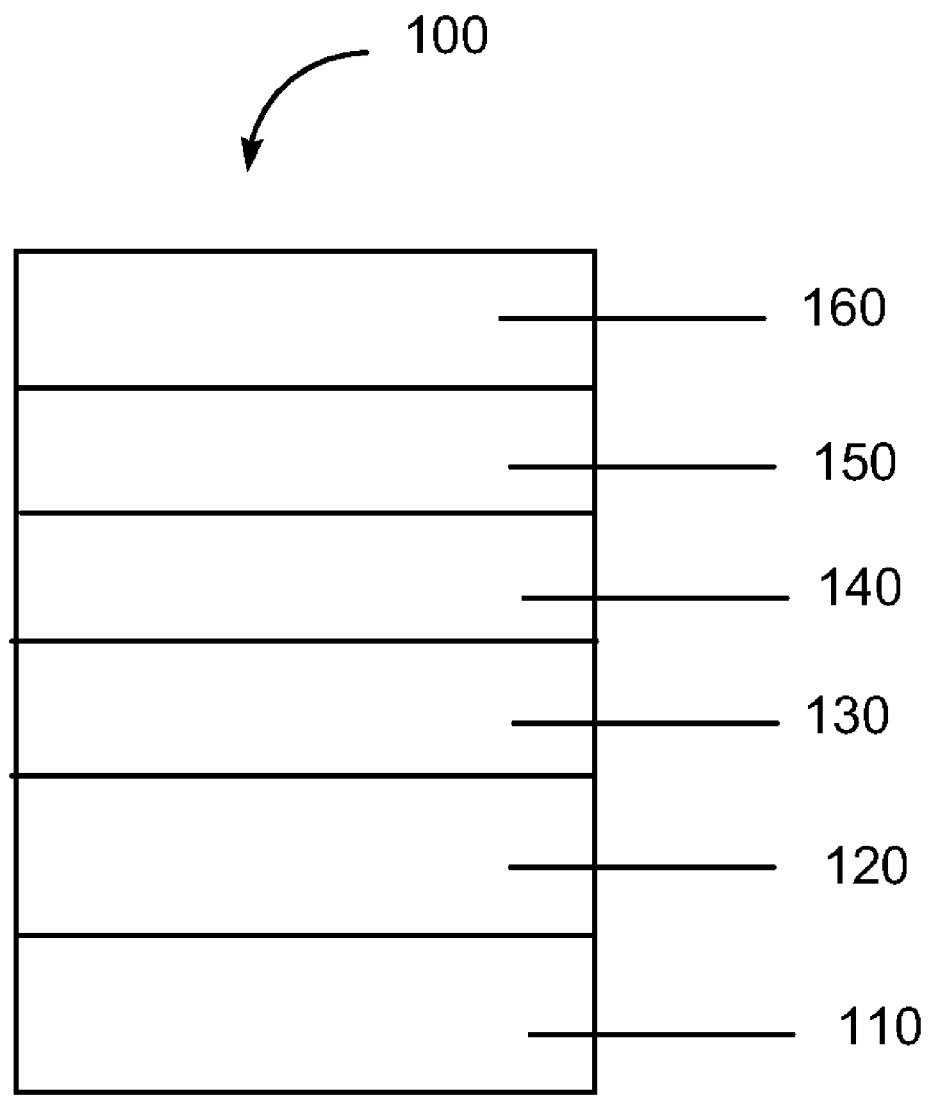

GREEN LUMINESCENT MATERIALS

RELATED APPLICATION DATA

This application claims priority under 35 U.S.C. §120 to U.S. application Ser. No. 12/129,770, filed May 30, 2008, which claims priority under 35 U.S.C. §119(e) from U.S. Provisional Application No. 60/941,380 filed on Jun. 1, 2007, which are incorporated by reference herein in its entirety.

BACKGROUND INFORMATION

1. Field of the Disclosure

This disclosure relates in general to green luminescent materials and their synthesis.

2. Description of the Related Art

Organic electronic devices that emit light, such as light-emitting diodes that make up displays, are present in many different kinds of electronic equipment. In all such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules, such as anthracene, thiadiazole derivatives, and coumarin derivatives are known to show electroluminescence. In some cases these small molecule materials are present as a dopant in a host material to improve processing and/or electronic properties.

There is a continuing need for new emissive materials, especially for luminescent compounds that are green-emitting.

SUMMARY

There is provided a green luminescent material having Formula I or Formula II

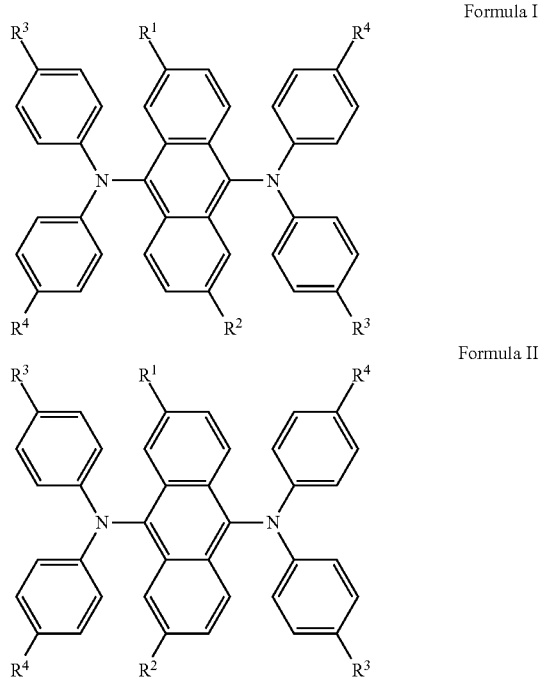

wherein:
- $R^1$ and $R^2$ are the same or different and are selected from the group consisting of hydrogen, alkoxy, tertiary alkyl, and cycloalkyl; and
- $R^3$ and $R^4$ are the same or different and are selected from the group consisting of fluorine, aryl and alkyl.

In some embodiments, at least one of $R^1$ and $R^2$ is not hydrogen.

There is also provided an organic electronic device comprising a first electrical contact, a second electrical contact and a photoactive layer therebetween, the photoactive layer comprising the above green luminescent material.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes an illustration of one example of an organic light-emitting diode.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are described herein and are merely exemplary and not limiting. After reading this specification, skilled artisans will appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Green Luminescent Materials, Synthesis, Devices, and finally Examples.

1. Definitions and Clarification of Terms

Before addressing details of embodiments described below, some terms are defined or clarified.

The term "alkoxy" is intended to mean a group having the formula —OR, which is attached via the oxygen, where R is an alkyl.

The term "alkyl" is intended to mean a group derived from an aliphatic hydrocarbon and includes a linear, a branched, or a cyclic group. In some embodiments, an alkyl has from 1-20 carbon atoms.

The term "cycloalkyl" is intended to mean an alkyl group having one or more ring structures. In some embodiments, a cycloalkyl has from 4-20 carbon atoms.

The term "secondary alkyl" is intended to mean an alkyl group which includes a secondary carbon. In some embodiments, a secondary alkyl has from 3-20 carbon atoms. The term "secondary carbon" is intended to mean a carbon linked to two additional carbons.

The term "tertiary alkyl" is intended to mean an alkyl group which includes a tertiary carbon. In some embodiments, a tertiary alkyl has from 4-20 carbon atoms. The term "tertiary carbon" is intended to mean a carbon linked to three additional carbons.

The term "aryl" is intended to mean a group derived from an aromatic hydrocarbon. The group may include one or more aromatic rings.

The terms "luminescent material" and "emitter" are intended to mean a material that emits light when activated by an applied voltage (such as in a light-emitting diode or light-emitting electrochemical cell).

The term "green luminescent material" is intended to mean a material capable of emitting radiation that has an emission maximum at a wavelength in a range of approximately 500-600 nm.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device" or sometimes just "electronic device" is intended to mean a device including one or more organic semiconductor layers or materials.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Green Luminescent Materials

The new green luminescent materials described herein have Formula I or Formula II

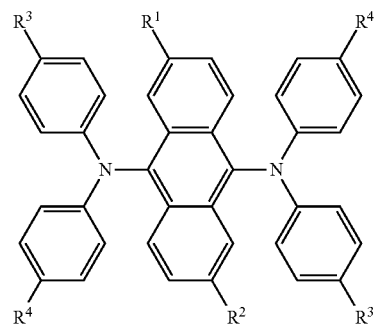

Formula I

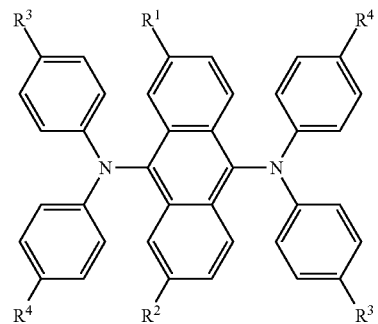

Formula II wherein:

$R^1$ and $R^2$ are the same or different and are selected from the group consisting of hydrogen, alkoxy, tertiary alkyl, and cycloalkyl.

$R^3$ and $R^4$ are the same or different and are selected from the group consisting of fluorine, aryl and alkyl.

In some embodiments, the alkoxy group has from 1-10 carbon atoms; in some embodiments, 1-5 carbons. Examples of suitable alkoxy groups include, but are not limited to, methoxy and ethoxy groups.

In some embodiments, the tertiary alkyl group has from 4-12 carbon atoms; in some embodiments, 4-6 carbons. Examples of suitable tertiary alkyl groups include, but are not limited to, tertiary butyl and neopentyl groups.

In some embodiments, the cycloalkyl group has from 6-20 carbon atoms; in some embodiments, 6-12. Examples of suitable cycloalkyl groups include, but are not limited to, cyclohexyl, 1-methylcyclohexyl, and 1-adamantyl groups.

In some embodiments, $R^1$ and $R^2$ are the same. In some embodiments, at least one of $R^3$ and $R^4$ is a secondary alkyl or a tertiary alkyl. In some embodiments, at least one of $R^3$ and $R^4$ is an aryl group. In some embodiments, the aryl group is selected from phenyl, naphthyl, biphenyl, and terphenyl groups. In some embodiments $R^3$ and $R^4$ are the same.

Examples of green luminescent materials having Formula I or Formula II include, but are not limited to, compounds G1 through G12 in Table 1 below:

TABLE 1

Green Luminescent Compounds

| Compound | Formula | R¹ | R² | R³ | R⁴ |
|---|---|---|---|---|---|
| G1 | I | H | H | i-propyl | t-butyl |
| G2 | I | t-butyl | H | i-propyl | t-butyl |
| G3 | I | t-butyl | t-butyl | i-propyl | t-butyl |
| G4 | I | 1-methylcyclohexyl | 1-methylcyclohexyl | i-propyl | t-butyl |
| G5 | II | 1-methylcyclohexyl | 1-methylcyclohexyl | i-propyl | t-butyl |
| G6 | I | methoxy | methoxy | i-propyl | t-butyl |
| G7 | I | 1-adamantyl | 1-adamantyl | i-propyl | t-butyl |
| G8 | II | 1-adamantyl | 1-adamantyl | i-propyl | t-butyl |
| G9 | I | t-butyl | t-butyl | F | F |
| G10 | I | 1-adamantyl | 1-adamantyl | phenyl | phenyl |
| G11 | I | 1-adamantyl | 1-adamantyl | t-butyl | 3-biphenyl |
| G12 | I | 1-adamantyl | 1-adamantyl | t-butyl | phenyl |

3. Synthesis

The green luminescent materials described herein, are generally prepared according to the following scheme:

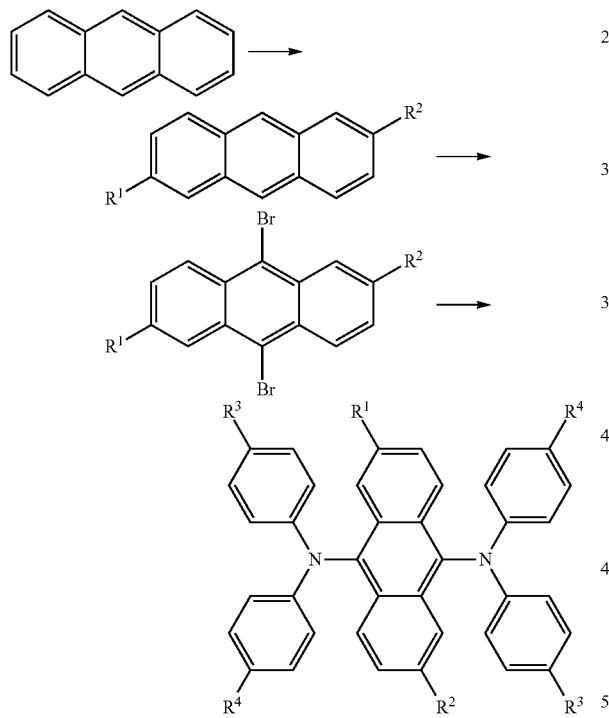

When $R^1=R^2$, the first step involved alkylation of anthracene using Friedel Crafts chemistry with the appropriate alcohol, for example, t-butanol, 1-adamantanol or 1-methylcyclohexanol. This can be carried out in a solvent such as neat trifluoroacetic acid, generally with heating, followed by isolation and chromatographic purification. For some of the compounds, the substituted anthracene is commercially available, such as 2-t-butylanthracene.

The substituted anthracene can then be brominated, such as by using $Br_2$ in $CCl_4$. For compounds where $R^1=R^2=H$, the dibromide is commercially available.

The brominated product is then reacted with the appropriate secondary amine with a Pd catalyst. The secondary amine can also be prepared by Pd catalyzed amination.

In cases where the substituent is an alkoxy group, the substituted anthracene intermediate can be prepared by etherification of dihydroxyanthroquinone, followed by hydride reduction.

In many cases, mixtures of the compounds having Formula I and Formula II are formed. The compounds can be separated or used as a mixture, depending upon the physical properties.

4. Devices

Organic electronic devices that may benefit from having one or more layers comprising the green luminescent materials described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode).

One illustration of an organic electronic device structure is shown in FIG. 1. The device 100 has a first electrical contact layer, an anode layer 110 and a second electrical contact layer, a cathode layer 160, and a photoactive layer 140 between them. Adjacent to the anode is a buffer layer 120. Adjacent to the buffer layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

In one embodiment, the different layers have the following range of thicknesses: anode 110, 500-5000 Å, in one embodiment 1000-2000 Å; buffer layer 120, 50-2000 Å, in one embodiment 200-1000 Å; hole transport layer 120, 50-2000 Å, in one embodiment 200-1000 Å; photoactive layer 130, 10-2000 Å, in one embodiment 100-1000 Å; layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

a. Photoactive Layer

The green luminescent materials described herein are particularly suited as the photoactive material in the photoactive layer 140. They can be used alone, in combination with other luminescent materials, or in a host material.

In some embodiments, the host is a bis-condensed cyclic aromatic compound.

In some embodiments, the host is an anthracene derivative compound. In some embodiments the compound has the formula:

An-L-An where:
An is an anthracene moiety;
L is a divalent connecting group.

In some embodiments of this formula, L is a single bond, —O—, —S—, N(R)—, or an aromatic group. In some embodiments, An is a mono- or diphenylanthryl moiety.

In some embodiments, the host has the formula:

A-An-A where:
An is an anthracene moiety;
A is an aromatic group.

In some embodiments, the host is a diarylanthracene. In some embodiments the compound is symmetrical and in some embodiments the compound is non-symmetrical.

In some embodiments, the host has the formula:

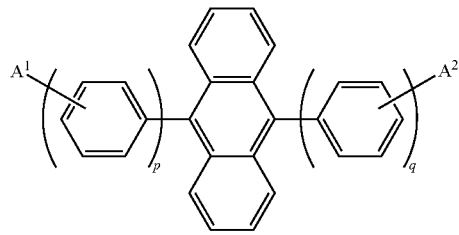

where:
$A^1$ and $A^2$ are the same or different at each occurrence and are selected from the group consisting of H, an aromatic group, and an alkenyl group, or A may represent one or more fused aromatic rings;

p and q are the same or different and are an integer from 1-3.

In some embodiments, the anthracene derivative is non-symmetrical. In some embodiments, p=2 and q=1. In some embodiments, at least one of $A^1$ and $A^2$ is a naphthyl group.

In some embodiments, the host is selected from the group consisting of

H1

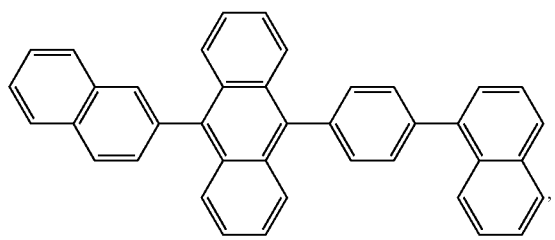

,

H2

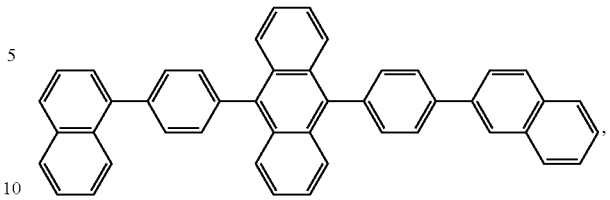

, and combinations thereof.

b. Other Device Layers

The other layers in the device can be made of any materials which are known to be useful in such layers.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

The buffer layer 120 comprises buffer material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device The buffer layer can be formed with polymeric materials, such as polyaniline (PANI) or polyethylenedioxythiophene (PEDOT), which are often doped with protonic acids. The protonic acids can be, for example, poly (styrenesulfonic acid), poly(2-acrylamido-2-methyl-1-propanesulfonic acid), and the like.

The buffer layer can comprise charge transfer compounds, and the like, such as copper phthalocyanine and the tetrathiafulvalene-tetracyanoquinodimethane system (TTF-TCNQ).

In some embodiments, the buffer layer comprises at least one electrically conductive polymer and at least one fluorinated acid polymer.

In some embodiments, the electrically conductive polymer will form a film which has a conductivity of at least $10^{-7}$ S/cm. The monomer from which the conductive polymer is formed, is referred to as a "precursor monomer". A copolymer will have more than one precursor monomer. In some embodiments, the conductive polymer is made from at least one precursor monomer selected from thiophenes, selenophenes, tellurophenes, pyrroles, anilines, and polycyclic aromatics. The polymers made from these monomers are referred to herein as polythiophenes, poly(selenophenes), poly(tellurophenes), polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In some embodiments, the polycyclic aromatic polymers are poly(thienothiophenes).

The fluorinated acid polymer can be any polymer which is fluorinated and has acidic groups with acidic protons. The term includes partially and fully fluorinated materials. In some embodiments, the fluorinated acid polymer is highly fluorinated. The term "highly fluorinated" means that at least 50% of the available hydrogens bonded to a carbon, have been replaced with fluorine. The acidic groups supply an ionizable proton. In some embodiments, the acidic proton has a pKa of less than 3. In some embodiments, the acidic proton has a pKa of less than 0. In some embodiments, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In some embodiments the fluorinated acid polymer is water-soluble. In some embodiments, the fluorinated acid polymer is dispersible in water. In some embodiments, the fluorinated acid polymer is organic solvent wettable.

In some embodiments, fluorinated acid polymer has a polymer backbone which is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In some embodiments, the polymer backbone is highly fluorinated. In some embodiments, the polymer backbone is fully fluorinated.

In some embodiments, the acidic groups are sulfonic acid groups or sulfonimide groups. A sulfonimide group has the formula:

where R is an alkyl group.

In some embodiments, the acidic groups are on a fluorinated side chain. In some embodiments, the fluorinated side chains are selected from alkyl groups, alkoxy groups, amido groups, ether groups, and combinations thereof.

In some embodiments, the fluorinated acid polymer has a fluorinated olefin backbone, with pendant fluorinated ether sulfonate, fluorinated ester sulfonate, or fluorinated ether sulfonimide groups. In some embodiments, the polymer is a copolymer of 1,1-difluoroethylene and 2-(1,1-difluoro-2-(trifluoromethyl)allyloxy)-1,1,2,2-tetrafluoroethanesulfonic acid. In some embodiments, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In some embodiments, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In some embodiments, the buffer layer is made from an aqueous dispersion of an electrically conducting polymer and a colloid-forming polymeric acid. Such materials have been described in, for example, published U.S. patent applications 2004-0102577, 2004-0127637, and 2005-0205860.

The hole transport layer 130 is a layer which facilitates migration of positive charges through the thickness of the layer with relative efficiency and small loss of charge. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

In some embodiments, the hole transport layer comprises a hole transport polymer. In some embodiments, the hole transport polymer is a distyrylaryl compound. In some embodiments, the aryl group is has two or more fused aromatic rings. In some embodiments, the aryl group is an acene. The term "acene" as used herein refers to a hydrocarbon parent component that contains two or more ortho-fused benzene rings in a straight linear arrangement.

In some embodiments, the hole transport polymer is an arylamine polymer. In some embodiments, it is a copolymer of fluorene and arylamine monomers.

In some embodiments, the polymer has crosslinkable groups. In some embodiments, crosslinking can be accomplished by a heat treatment and/or exposure to UV or visible radiation. Examples of crosslinkable groups include, but are not limited to vinyl, acrylate, perfluorovinylether, 1-benzo-3,4-cyclobutane, siloxane, and methyl esters. Crosslinkable polymers can have advantages in the fabrication of solution-process OLEDs. The application of a soluble polymeric material to form a layer which can be converted into an insoluble film subsequent to deposition, can allow for the fabrication of multilayer solution-processed OLED devices free of layer dissolution problems.

Examples of crosslinkable polymers can be found in, for example, published US patent application 2005-0184287 and published PCT application WO 2005/052027.

In some embodiments, the hole transport layer comprises a polymer which is a copolymer of 9,9-dialkylfluorene and triphenylamine. In some embodiments, the polymer is a copolymer of 9,9-dialkylfluorene and 4,4'-bis(diphenylamino)biphenyl. In some embodiments, the polymer is a copolymer of 9,9-dialkylfluorene and TPB. In some embodiments, the polymer is a copolymer of 9,9-dialkylfluorene and NPB. In some embodiments, the copolymer is made from a third comonomer selected from (vinylphenyl)diphenylamine and 9,9-distyrylfluorene or 9,9-di(vinylbenzyl)fluorene. In some embodiments, the hole transport material can be admixed with an electron acceptor material or an electron donor material.

The electron transport layer 150 is a layer which facilitates migration of negative charges through the thickness of the layer with relative efficiency and small loss of charge. Examples of electron transport materials which can be used in the optional electron transport layer 140, include metal chelated oxinoid compounds, such as tris(8-hydroxyquinolato) aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthrolines such as 4,7-diphenyl-1,10-phenanthroline (DPA) or further substituted versions of DPA, and 2,9-dimethyl-4,7-diphenyl-1,10-phenanthroline (DDPA); and mixtures thereof. In some embodiments, the electron transport material can be admixed with an electron acceptor material or an electron donor material.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li- and Cs-containing organometallic compounds, LiF, $Li_2O$, and CsF can also be deposited between the organic layer 150 and the cathode layer 160 to lower the operating voltage. This layer, not shown, may be referred to as an electron injection layer.

c. Device Fabrication

The device layers can be formed by any deposition technique, or combinations of techniques, including vapor deposition, liquid deposition, and thermal transfer.

In some embodiments, the device is fabricated by liquid deposition of the buffer layer, the hole transport layer, and the photoactive layer, and by vapor deposition of the anode, the electron transport layer, an electron injection layer and the cathode.

The buffer layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is selected from the group consisting of alcohols, ketones, cyclic ethers, and polyols. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof. The buffer material can be present in the liquid medium in an amount from 0.5 to 10 percent by weight. Other weight percentages of buffer material may be used depending upon the liquid medium. The buffer layer can be applied by any continuous or discontinuous liquid deposition technique. In one embodiment, the buffer layer is applied by spin coating. In one embodiment, the buffer layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 100° C. and 275° C. In one embodiment, the heating temperature is between 100° C. and 120° C. In one embodiment, the heating temperature is between 120° C. and 140° C. In one embodiment, the heating temperature is between 140° C. and 160° C. In one embodiment, the heating temperature is between 160° C. and 180° C. In one embodiment, the heating temperature is between 180° C. and 200° C. In one embodiment, the heating temperature is between 200° C. and 220° C. In one embodiment, the heating temperature is between 190° C. and 220° C. In one embodiment, the heating temperature is between 220° C. and 240° C. In one embodiment, the heating temperature is between 240° C. and 260° C. In one embodiment, the heating temperature is between 260° C. and 275° C. The heating time is dependent upon the temperature, and is generally between 5 and 60 minutes. In one embodiment, the final layer thickness is between 5 and 200 nm. In one embodiment, the final layer thickness is between 5 and 40 nm. In one embodiment, the final layer thickness is between 40 and 80 nm. In one embodiment, the final layer thickness is between 80 and 120 nm. In one embodiment, the final layer thickness is between 120 and 160 nm. In one embodiment, the final layer thickness is between 160 and 200 nm.

The hole transport layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, xylene, mesitylene, anisole, and mixtures thereof. The hole transport material can be present in the liquid medium in a concentration of 0.2 to 2 percent by weight. Other weight percentages of hole transport material may be used depending upon the liquid medium. The hole transport layer can be applied by any continuous or discontinuous liquid deposition technique. In one embodiment, the hole transport layer is applied by spin coating. In one embodiment, the hole transport layer is applied by ink jet printing. After liquid deposition, the liquid medium can be removed in air, in an inert atmosphere, or by vacuum, at room temperature or with heating. In one embodiment, the layer is heated to a temperature of 300° C. or less. In one embodiment, the heating temperature is between 170° C. and 275° C. In one embodiment, the heating temperature is between 170° C. and 200° C. In one embodiment, the heating temperature is between 190° C. and 220° C. In one embodiment, the heating temperature is between 210° C. and 240° C. In one embodiment, the heating temperature is between 230° C. and 270° C. In one embodiment, the heating temperature is between 270° C. and 300° C. The heating time is dependent upon the temperature, and is generally between 5 and 60 minutes. In one embodiment, the final layer thickness is between 5 and 50 nm. In one embodiment, the final layer thickness is between 5 and 15 nm. In one embodiment, the final layer thickness is between 15 and 25 nm. In one embodiment, the final layer thickness is between 25 and 35 nm. In one embodiment, the final layer thickness is between 35 and 50 nm.

The photoactive layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic solvent is selected from chloroform, dichloromethane, toluene, anisole, 2-butanone, 3-pentanone, butyl acetate, acetone, xylene, mesitylene, chlorobenzene, tetrahydrofuran, diethyl ether, trifluorotoluene, and mixtures thereof. The photoactive material can be present in the liquid medium in a concentration of 0.2 to 2 percent by weight. Other weight percentages of photoactive material may be used depending upon the liquid medium. The photoactive layer can be applied by any continuous or discontinuous liquid deposition technique. In one embodiment, the photoactive layer is applied by spin coating. In one embodiment, the photoactive layer is applied by ink jet printing. After liquid deposition, the liquid medium can be removed in air, in an inert atmosphere, or by vacuum, at room temperature or with heating. Optimal baking conditions depend on the vapor pressure properties of the liquids being removed and their molecular interaction with the liquids. In one embodiment, the deposited layer is heated to a temperature that is greater than the Tg of the material having the highest Tg. In one embodiment, the deposited layer is heated between 10 and 20° C. higher than the Tg of the material having the highest Tg. In one embodiment, the deposited layer is heated to a temperature that is less than the Tg of the material having the lowest Tg. In one embodiment, the heating temperature is at least 10° C. less than the lowest Tg. In one embodiment, the heating temperature is at least 20° C. less than the lowest Tg. In one embodiment, the heating temperature is at least 30° C. less than the lowest Tg. In one embodiment, the heating temperature is between 50° C. and 150° C. In one embodiment, the heating temperature is between 50° C. and 75° C. In one embodiment, the heating temperature is between 75° C. and 100° C. In one embodiment, the heating temperature is between 100° C. and 125° C. In one embodiment, the heating temperature is between 125° C. and 150° C. The heating time is dependent upon the temperature, and is generally between 5 and 60 minutes. In one embodiment, the final layer thickness is between 25 and 100 nm. In one embodiment, the final layer thickness is between 25 and 40 nm. In one embodiment, the final layer thickness is between 40 and 65 nm. In one embodiment, the final layer thickness is between 65 and 80 nm. In one embodiment, the final layer thickness is between 80 and 100 nm.

The electron transport layer can be deposited by any vapor deposition method. In one embodiment, it is deposited by thermal evaporation under vacuum. In one embodiment, the final layer thickness is between 1 and 100 nm. In one embodiment, the final layer thickness is between 1 and 15 nm. In one embodiment, the final layer thickness is between 15 and 30 nm. In one embodiment, the final layer thickness is between 30 and 45 nm. In one embodiment, the final layer thickness is between 45 and 60 nm. In one embodiment, the final layer thickness is between 60 and 75 nm. In one embodiment, the final layer thickness is between 75 and 90 nm. In one embodiment, the final layer thickness is between 90 and 100 nm.

The electron injection layer can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. The vapor deposition rates given herein are in units of Angstroms per second. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 0.1 and 3 nm. In one embodiment, the final layer thickness is between 0.1 and 1 nm. In one embodiment, the final layer thickness is between 1 and 2 nm. In one embodiment, the final layer thickness is between 2 and 3 nm.

The cathode can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 10 and 10000 nm. In one embodiment, the final layer thickness is between 10 and 1000 nm. In one embodiment, the final layer thickness is between 10 and 50 nm. In one embodiment, the final layer thickness is between 50 and 100 nm. In one embodiment, the final layer thickness is between 100 and 200 nm. In one embodiment, the final layer thickness is between 200 and 300 nm. In one embodiment, the final layer thickness is between 300 and 400 nm. In one embodiment, the final layer thickness is between 400 and 500 nm. In one embodiment, the final layer thickness is between 500 and 600 nm. In one embodiment, the final layer thickness is between 600 and 700 nm. In one embodiment, the final layer thickness is between 700 and 800 nm. In one embodiment, the final layer thickness is between 800 and 900 nm. In one embodiment, the final layer thickness is between 900 and 1000 nm. In one embodiment, the final layer thickness is between 1000 and 2000 nm. In one embodiment, the final layer thickness is between 2000 and 3000 nm. In one embodiment, the final layer thickness is between 3000 and 4000 nm. In one embodiment, the final layer thickness is between 4000 and 5000 nm. In one embodiment, the final layer thickness is between 5000 and 6000 nm. In one embodiment, the final layer thickness is between 6000 and 7000 nm. In one embodiment, the final layer thickness is between 7000 and 8000 nm. In one embodiment, the final layer thickness is between 8000 and 9000 nm. In one embodiment, the final layer thickness is between 9000 and 10000 nm.

EXAMPLES

The concepts described herein will be further described in the following examples, which do not limit the scope of the invention described in the claims.

Examples 1-10

These examples illustrate the preparation of compounds G1 through G12. The solution photoluminescence data for these compounds is given in Table 2.

Example 1

This example demonstrates the preparation of an intermediate secondary amine compounds.
(a) Amine 1:

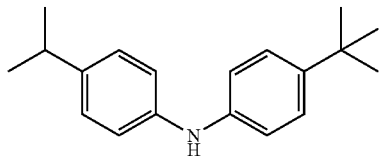

Amine 1

21.2 g of 4-bromo-t-butylbenzene (100 mM) and 13.5 g (100 mM) 4-i-propylaniline were mixed in a 500 mL flask in a nitrogen atmosphere glove $C_{10}H_{13}Br$
Exact Mass: 212:02
Mol. Wt.: 213.11
C, 56.36; H, 6.15; Br, 37.49

$C_9H_{13}N$
Exact Mass: 135.10
Mol. Wt.: 135.21
C, 79.95; H, 9.69; N, 10.36 box. 1.0 g $Pd_2DBA_3$ (1.08 mM), 0.44 g P(t-Bu)$_3$ (2.16 mM) and 10.6 g t-BuONa (110 mM) were added and all dissolved into 250 mL dry toluene. Upon addition of the Pd catalyst materials there is a sharp exotherm. Heat in glove box in mantle at 80° C. for 3 hrs then at room temp under nitrogen overnight. Cool and work up by silica chromatography (hexanes:toluene 1:1) product runs between starting materials) to generate the secondary amine.

The product was collected as an off-white crystalline solid (~21 g) from ethanol/water. The structure was confirmed by 1-H nmr analysis.
(b) Amine 2 was prepared in a similar fashion using 4-fluoroaniline and 4-fluoro-bromobenzene

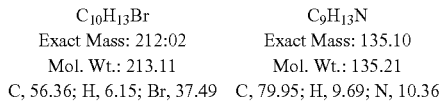

Amine 2

(c) Amine 3 was prepared in a similar fashion using 4-aminobiphenyl and 4-bromobiphenyl

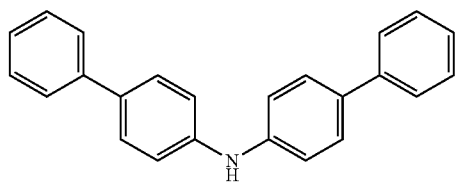

Amine 3

(d) Amine 4 was prepared in a similar fashion using 4-t-butylaniline and 4-(3-biphenyl)-bromobenzene

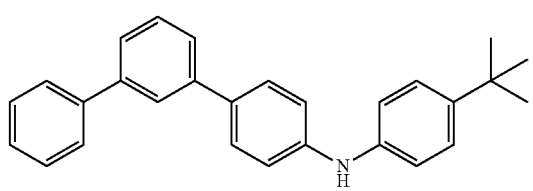

Amine 4

(e) Amine 5 was prepared in a similar fashion using 4-t-butylaniline and 4-bromobiphenyl

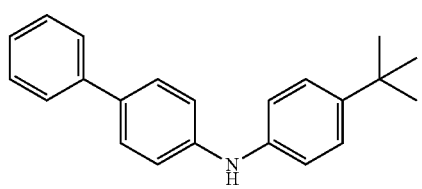

Amine 5

Example 2

This example demonstrates the preparation of Compounds G1 and G2.

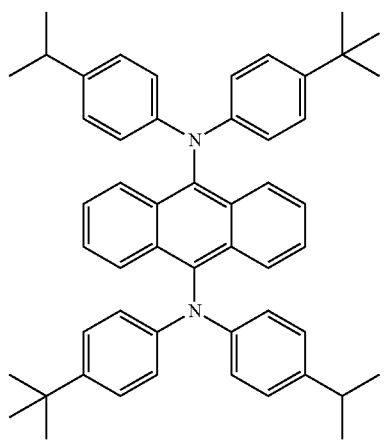

G1

3.34 g of dibromoanthracene (10 mM, Aldrich) and 5.4 g (21 mM) 4-i-propyl, 4-t-butylaniline (Amine1) were mixed into 50 mL dry toluene in a

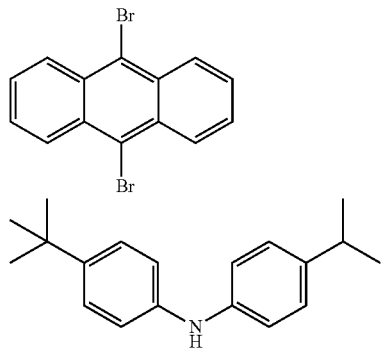

nitrogen-filled glove box. 1.0 g $Pd_2$ $DBA_3$ (1.0 mM), 0.41 g $P(t-Bu)_3$ (2.0 mM) and 2.4 g t-BuONa (24 mM) were all dissolved into 50 mL toluene and added to the reaction flask. The resulting slurry was stirred and heated in the glove box in a mantle at 80° C. under nitrogen overnight. The solution is immediately dark purple but on reaching ~80° C. it is dark yellow-green with noticeable green photoluminescence. The resulting solution was cooled and removed from the glove box and filtered through an alumina plug eluting with methylene chloride.

After filtration through the alumina pad and rinsing with methylene chloride, the deep green solution was evaporated to low volume. Yellow microcrystals begin to form and addition of methanol precipitated a yellow powdery material. Filtration and washing with methanol yields 6.5 g of yellow microcrystals. Analysis by 1-H nmr in $CDCl_3$ confirmed the desired product. The material was sublimed under high vacuum prior to evaluation in devices.

Compound G2 was made in an analogous manner, starting with 9,10-dibromo-2-t-butylanthracene in place of 9,10-dibromoanthracene.

Example 3

This example demonstrates the preparation of Compound G3.

Step 1: t-butylation of anthracene:

7.13 g (40 mM) anthracene and 10.8 g t-butanol (120 mM) were mixed in 40 mL trifluoroacetic acid and refluxed for 15 hrs with vigorous stirring. The cooled solution was then poured into 300 mL ice cold water and the resulting ppt was collected by filtration. The off white solid was dried in vacuum and then recrystallized from hot toluene/methanol to yield ~8 g colorless crystals (~70% yield) whose identity as 2,6-di-t-butylanthracene was confirmed by nmr.

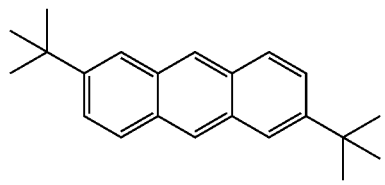

Step 2: bromination of 2,6-di-t-butylanthracene 4.94 g (17 mM) 2,6-di-t-butylanthracene was dissolved into 100 mL carbon tetrachloride and 1.76 mL bromine (34 mM) was added dropwise with stirring at room temperature and the resulting mixture was stirred at room temperature for 4 hrs. The pale orange solution was poured into water and excess sodium sulfite to added consume any remaining bromine. The organic phase was collected and combined with methylene chloride used to extract the aqueous layer. The organic layers were dried over anhydrous magnesium sulfate and then evaporated. The recovered solid was recrystallized from hot ethanol. The recovered yellow solid was further recrystallized from methylene chloride/methanol to give ~4.9 g of pale yellow crystals whose identity was confirmed by 1-H nmr.

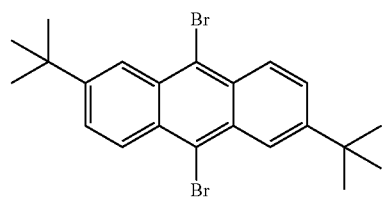

Step 3: Amination of the dibromoanthracene

The procedure used for compound G1 described in Example 2 above was followed using the 9,10-dibromo-2,6-di-t-butylanthracene from step 2 in place of 9,10-dibromoanthracene.

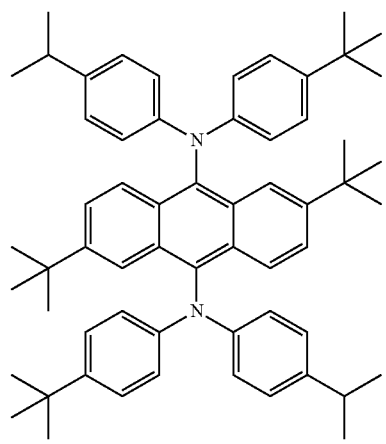

This material appeared to be sparingly soluble in toluene and methylene chloride so was extracted by soxhlet using methylene chloride. Evaporation of the dark green solution generated bright yellow microcrystals which were intensely green luminescent. Soxhlet extracted material gives ~5.7 g of yellow microcrystals. 1-H nmr in $CD_2Cl_2$ confirmed the identity of the material which was further purified by sublimation prior to device evaluation.

Example 4

This example demonstrates the preparation and separation of compounds G4 and G5 which were made in an analogous manner to compound G3, starting with 1-methylcyclohexanol in place of t-butanol in step 1.

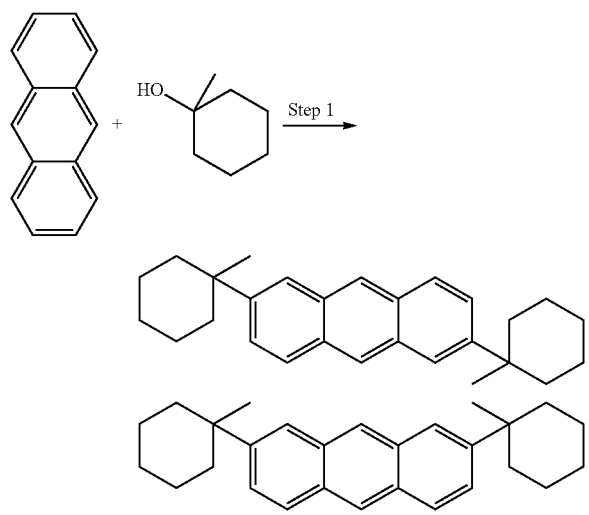

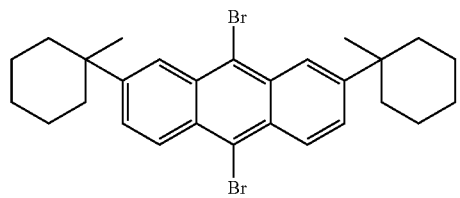

Anthracene (10 g, 56 mmol) and trifluoroacetic acid (TFA) (56 mL) were taken in a three neck round bottom flask, equipped with a stir-bar, reflux condenser and a dropping funnel containing methylcylohexanol (19.25 g, 168 mmol). The resulting slurry was brought to reflux under nitrogen and methylcylohexanol added to it in ~5 ml batches over a period of 6 h. The reaction mixture turned purple-brown after the first addition and the reaction temperature (oil bath) was raised to 110° C. The reaction was stirred vigorously overnight and an additional equivalent of methylcyclohexanol (6.41 g, 56 mmol) was added over a period of 30 min and the reaction allowed to reflux another 24 h. GC-MS showed completed reaction, and no anthracene or mono-alkylated product, therefore the reaction mixture was cooled and filtered to remove TFA. The brownish solid residue was washed with ether until the filtrate ran clear (~250 mL). The resulting pale yellow product (15.8 g, 76%) was collected and considered pure enough by GC-MS and 1-H nmr for further use. 1-H nmr clearly showed the presence of both 2,6- and 2,7-alkylated isomers with the latter being the minor product.

Methylcyclohexylanthracene (14 g, 37.8 mmol) from the previous step and carbontetrachloride (190 ml) were taken in a round bottom flask, equipped with a stir bar and a dropping funnel containing bromine (12 g, 75.6 mmol) under nitrogen. Bromine was added dropwise to the stirred slurry over a period of 3 h until the solution became clear and GC-MS showed no more starting material. The reaction was allowed to stir for another hour and excess Bromine neutralized with a solution of $Na_2S_2O_3$. The two layers were separated and the aqueous layer extracted with 2×50 ml $CCl_4$. The combined organic layers were dried (anhyd $MgSO_4$) and concentrated to give a yellow solid which was stirred in refluxing EtOH for 30 min and the resulting slurry allowed to cool over night. The resulting pale yellow solid was collected by filtration and dried under vacuum to yield 18.5 g (92.6%) of the desired brominated compound as a mixture of 2,6- and 2,7-alkylated products.

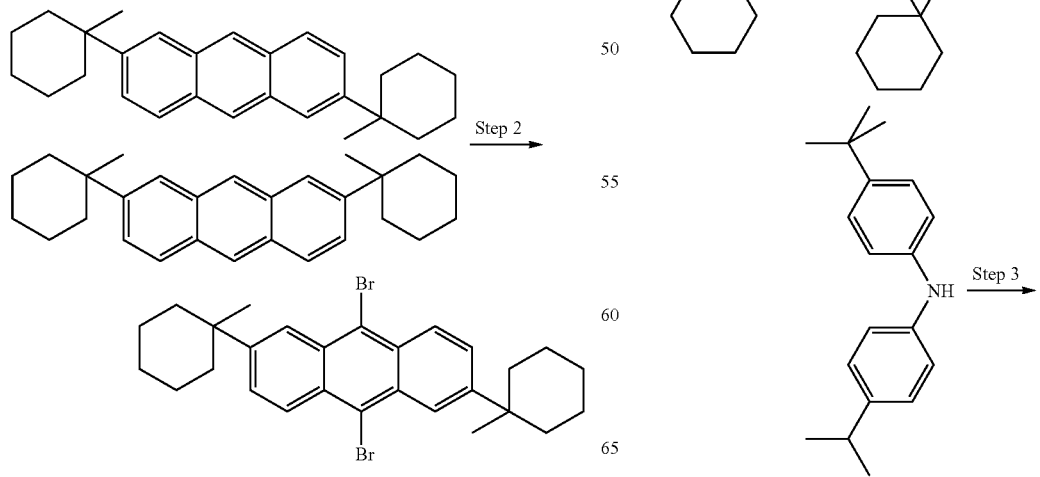

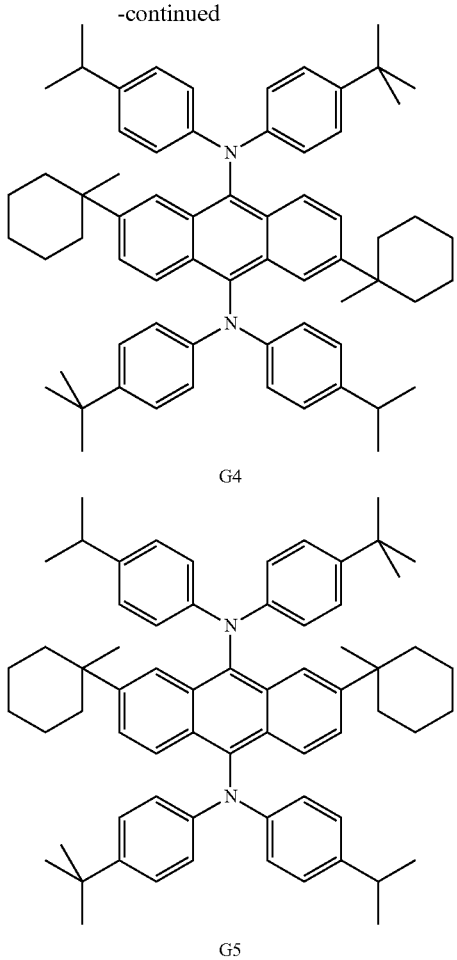

G4

G5

9-10-Dibromo-dimethylcyclohexylanthracene (18 g, 34 mmol) and 4-tert-butyl-N-(4-isopropylphenyl)benzenamine (19.1 g, 71.5 mmol) were taken in a 1 L round-bottom flask under nitrogen and 200 ml of dry degassed toluene was added to the flask yielding a yellow slurry. A 40 ml vial was charged with $Pd_2(dba)_3$ (0.3 g, 0.3 mmol), $P(^tBu)_3$ (0.14 g, 0.7 mmol) and 15 ml of dry toluene and left to stir in the glove box. After ten minutes, its contents were added to the reaction flask. After further ten minutes of stirring, sodium tert-butoxide (7.9 g, 81.8 mmol) was added in portions to the reaction flask under nitrogen and the reaction warmed in an 80° C. sand bath overnight. CI-LCMS showed that the reaction had not gone to completion therefore reaction was cooled and another batch of $Pd_2(dba)_3$ (1.25 g, 1.4 mmol) and $P(^tBu)_3$ (0.55 g, 2.7 mmol) was added to it and the stirring continued over night. Reaction mixture was filtered through a 2+2" plug of silica+celite and washed with toluene and DCM until the flow through became clear. Filtrate was concentrated under reduced pressure resulting in dark yellow oil which yielded a yellow powder on standing. The powder was collected by filtration and washed with ether to yield a first crop of 10.82 g (35%) G4. nmr showed that the concentrated filtrate contained both G4 and G5. A second precipitation yielded 11.22 g (36.5%) of approximately equal amounts G4 and G5 product and extremely dirty brown material containing mostly G5 and other impurities. This last was purified by silica gel chromatography using 1:15 DCM:hexane as the eluent to yield 3.8 g (12.4%) of predominantly G5 (73%).

Example 5

This example demonstrates the preparation of Compound G6.

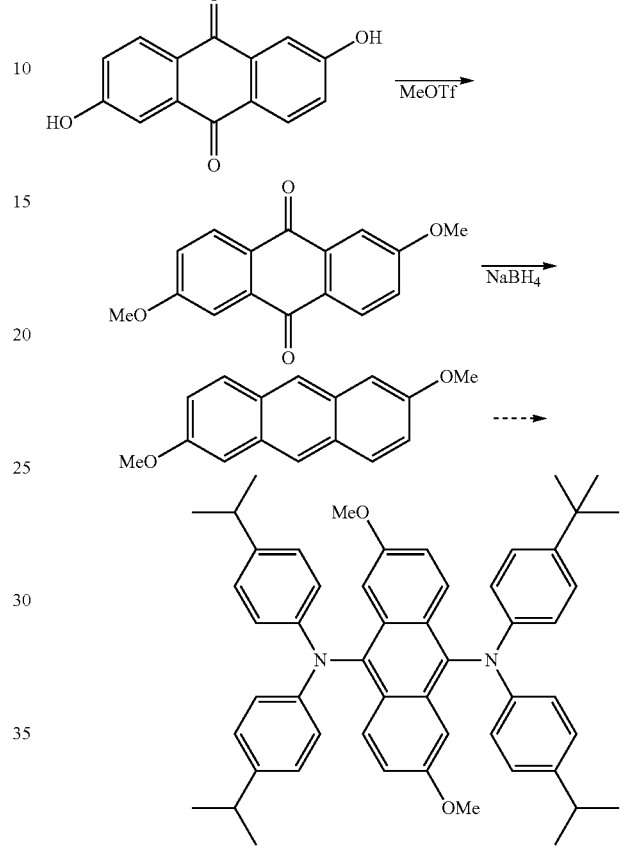

Step 1

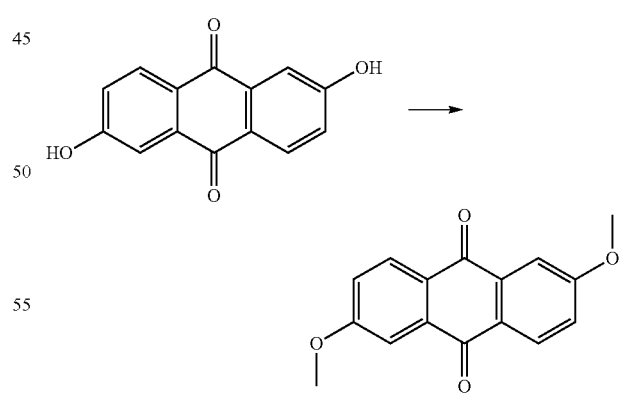

2,6-dihydroxyanthraquinone (50 g, 0.2082 mol), sodium carbonate (35.0 g, 0.3302 mol), and o-dichlorobenzene (800 mL) were combined in a 2 L flask with magnetic stirring, a water cooled condenser, and with $N_2$ blanketing. Methyl-p-toluenesulfonate (110.0 g, 0.5907 mol) was added over ~20 minutes and the mixture heated to 178° C. overnight. The slurry was cooled to 70° C. and added to 1 L of water. The mixture was filtered and the filter cake washed with water and methanol and dried to yield 43.8 g of a light tan solid for a 78% yield.

Step 2

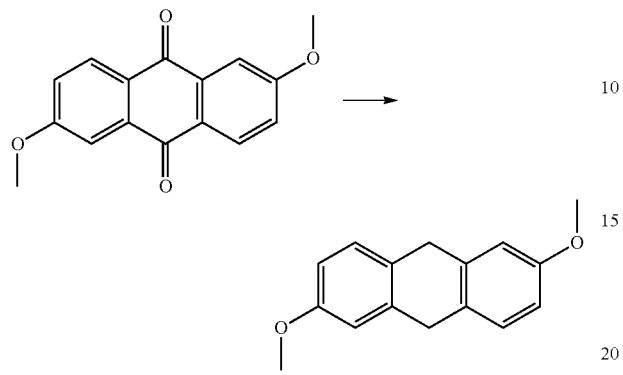

Combined 2,6-dimethoxyanthraquinone (16.7 g, 0.0623 mol) from step 1 above with 1250 mL isopropyl alcohol and degassed with nitrogen for 30 minutes. Added $NaBH_4$ (49 g, 1.295 mol) and refluxed overnight. Cooled and evaporated solvent and added 500 mL of iced water followed by 135 g of conc. HCl in portions until pH<2. Extracted aqueous mixture with dichloromethane and concentrated to 13.31 g of black solid which was preabsorbed onto 61 g of silica and purified by silica column chromatography eluting with hexanes and dichloromethane then recrystallized from chloroform yielding 1.58 g of product. The mother liquor material was purified by silica column chromatography again to yield another 1.28 g of product for a total yield of 19%

Step 3

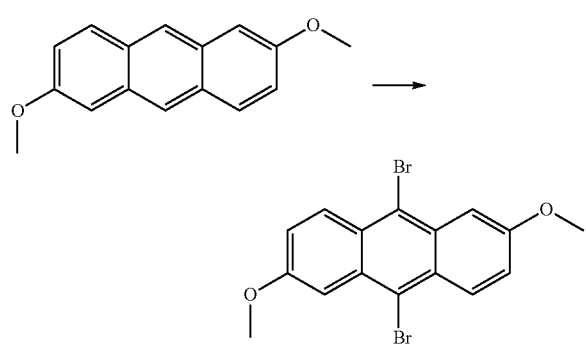

2,6-dimethoxyanthracene (2.49 g, 0.0105 mol), and 114 mL of carbon tetrachloride were combined and bromine (3.78 g, 0.0237 mol) in portions until no change was detected by nmr. The mixture was diluted with 700 mL dichloromethane and washed with 200 mL water and $Na_2S_2O_4$ (11 g, 0.0696 mol). Organics were separated, concentrated and purified by column chromatography. Well purified material totaled 0.3 g yielding 7% but impure material needing further purification totaled 2.18 g for a crude yield of 45%

Step 4

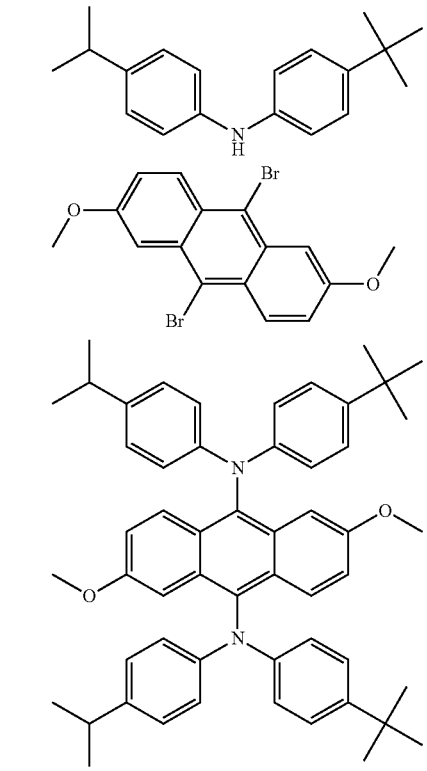

Combined 4-t-butyl-4'-isopropyldiphenylamine (0.421 g, 0.0016 mol), 2,6-dimethoxy-9,10-dibromoanthracene (0.2495 g, 0.00063 mol), $Pd_2 DBA_3$ (0.0419 g, 0.0457 mmol), tri-t-butylphosphine (0.0185 g, 0.0914 mmol), sodium t-butoxide (0.1211 g, 1.26 mmol), and 8 mL toluene. Ran at 95° C. over 50 hours. Purified by column chromatography on basic-alumina then precipitation from dichloromethane with acetonitrile to yield 100 mg of pure material for a 20% yield.

Example 6

This example demonstrates the preparation of Compounds G7 and G8.

The two isomers of the bis-1-adamantyl anthracene were prepared in an analogous manner to those of G4 and G5 above using 1-adamantanol in place of 1-methylcyclohexanol. Separation of the G7 from the G8 isomer is best achieved by separation of the initial products of alkylation prior to the bromination step. The 2,7-bis-1-adamantyl anthracene (the isomer leading to G8) being the more soluble material and so extraction with toluene at this stage leaves behind the 2,6 isomer and provides a solution of the 2,7 isomer. Subsequent recrystallization from methylene chloride of the isolated solids further purifies each individual isomer. The final G7 and G8 materials are both quite soluble in toluene and were further purified by sublimation prior to device evaluation. 1-H nmr spectroscopy identified the individual materials and confirmed their isomeric assignments:

(G7)

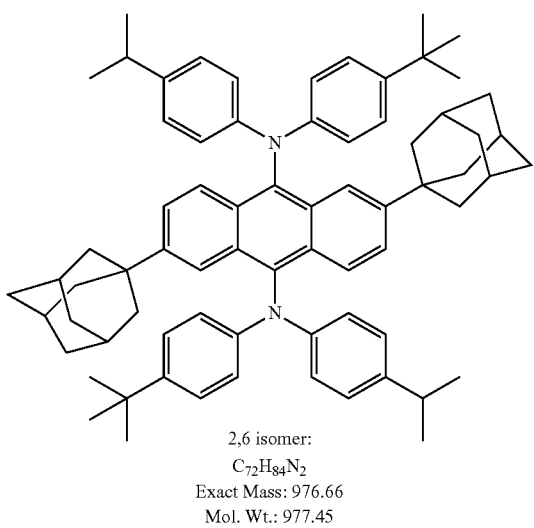

2,6 isomer:
$C_{72}H_{84}N_2$
Exact Mass: 976.66
Mol. Wt.: 977.45

(G8)

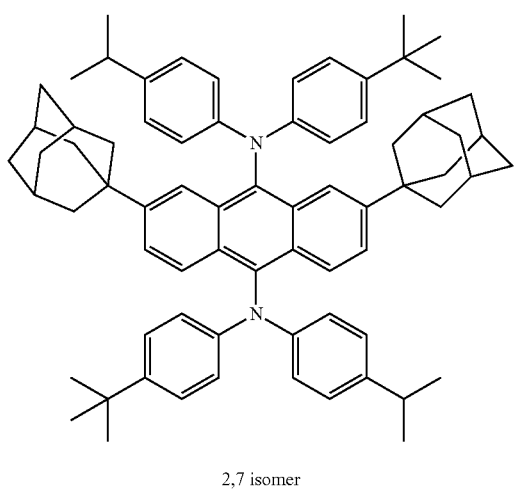

2,7 isomer

Example 7

This example demonstrates the preparation of compound G9

G9

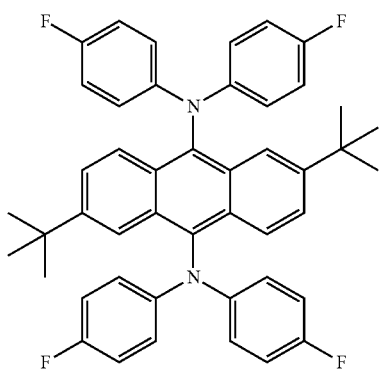

2.25 g of the 9,10-dibromo-2,6-di-t-butyl-anthracene (5 mM) and 2.25 g (11 mM) amine 2 were mixed in 25 mL toluene in a nitrogen glove box. 0.5 g $Pd_2$ $DBA_3$ (0.5 mM), 0.20 g tri-t-butylphosphine (1 mM) and 1.0 g t-BuONa (20 mM) were mixed and dissolved into 10 mL toluene. Then two solutions were mixed and heated in the glove box at 80° C. for 1 hr then warmed gently (~50° C.) under nitrogen overnight. The mixed solution is immediately dark purple but on reaching 80° C. it becomes dark yellow-brown. The solution is cooled, removed from the glove box and filtered through an alumina plug eluting with methylene chloride. TLC of the light yellow filtrate shows a bright green photoluminescent spot. Further purification on Florisil eluting with methylene chloride collected a bright yellow solution (with visible green photoluminescence in room light) which crystallized on addition of methanol and standing o/n. Final recrystallization from toluene by addition of methanol yielded ~2.5 g bright yellow crystals. The yellow solid was identified as the desired compound (wet with a little toluene) by 1-H nmr and then further purified by train sublimation prior to device evaluation.

Example 8

This example demonstrates the preparation of compound G10

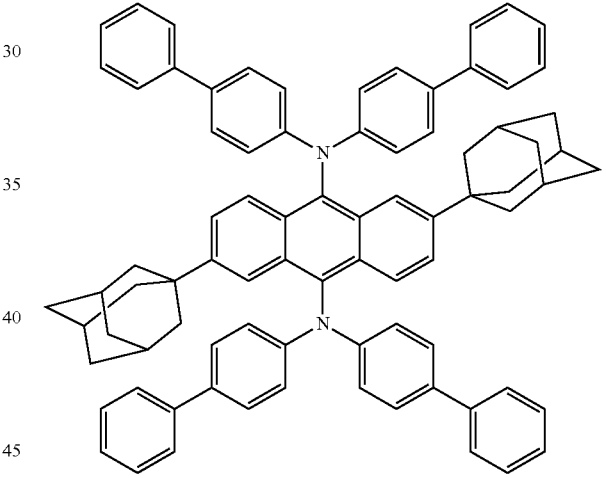

0.94 g of the 9,10-dibromo-2,6-di-(1-adamantyl)-anthracene (1.5 mM) (see Example 6 above) and 1.0 g (3.1 mM) amine 3 were mixed in 10 mL toluene in a nitrogen glove box. 0.15 g $Pd_2$ $DBA_3$ (0.15 mM), 0.06 g tri-t-butylphosphine (0.3 mM) and 0.32 g t-BuONa (3.3 mM) were mixed and dissolved into 10 mL toluene. Then two solutions were mixed and heated in the glove box at 80° C. for 1 hr then warmed gently (~50° C.) under nitrogen overnight. The mixed solution is immediately dark purple but on reaching 80° C. it becomes dark yellow-brown. The solution is cooled, removed from the glove box and filtered through an alumina plug eluting with methylene chloride. TLC of the light yellow filtrate shows a bright green photoluminescent spot. Further purification on FLORISIL eluting with methylene chloride collected a bright yellow solution (with visible green photoluminescence in room light) which crystallized on addition of methanol. Final recrystallization from toluene yielded ~1.1 g bright yellow crystals. The yellow solid was identified as the desired compound (wet with a little toluene) by 1-H nmr and then further purified by train sublimation prior to device evaluation.

Example 9

This example demonstrates the preparation of compound G11

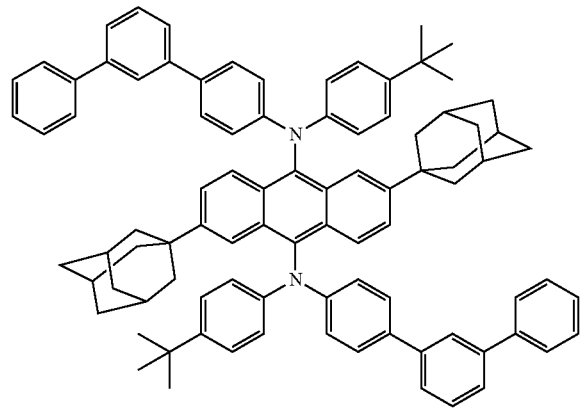

3.02 g of the 9,10-dibromo-2,6-di-(1-adamantyl)-anthracene (5 mM) (see Example 6 above) and 3.85 g (11 mM) amine 4 were mixed in 25 mL toluene in a nitrogen glove box. 0.5 g Pd$_2$ DBA$_3$ (0.5 mM), 0.20 g tri-t-butylphosphine (1 mM) and 1.0 g t-BuONa (20 mM) were mixed and dissolved into 10 mL toluene. Then two solutions were mixed and heated in the glove box at 80° C. for 1 hr then warmed gently (~50° C.) under nitrogen overnight. The mixed solution is immediately dark purple but on reaching 80° C. it becomes dark yellow-brown. The solution is cooled, removed from the glove box and filtered through an alumina plug eluting with methylene chloride. TLC of the deep orange filtrate shows a bright green photoluminescent spot. Further purification on FLORISIL and then on neutral alumina eluting with methylene chloride collected a bright yellow solution (with visible green photoluminescence in room light) which crystallized on addition of methanol and standing o/n. Final recrystallization from toluene by addition of methanol yielded ~2.2 g bright yellow crystals. The yellow solid was identified as the desired compound (wet with a little toluene and methanol) by 1-H nmr and then further purified by train sublimation prior to device evaluation.

Example 10

This example demonstrates the preparation of compound G12

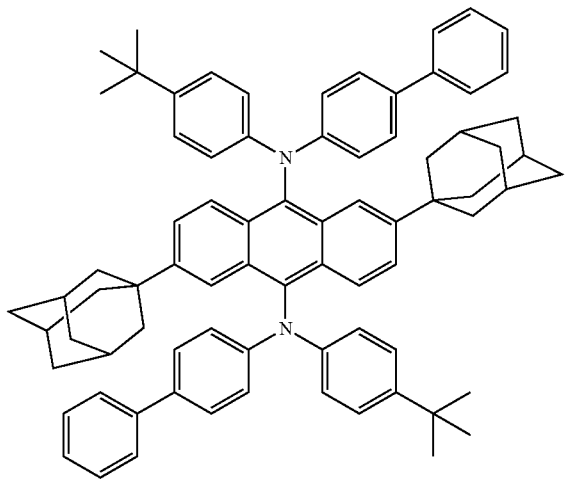

0.25 g of the 9,10-dibromo-2,6-di-(1-adamantyl)-anthracene (0.42 mM) (see Example 6 above) and 0.3 g (1 mM) amine 5 were mixed in 10 mL toluene in a nitrogen glove box. 0.04 g Pd$_2$ DBA$_3$ (0.04 mM), 0.017 g tri-t-butylphosphine (0.08 mM) and 0.1 g t-BuONa (1 mM) were mixed and dissolved into 10 mL toluene. Then two solutions were mixed and heated in the glove box at 80° C. for 1 hr then warmed gently (~50° C.) under nitrogen overnight. The mixed solution is immediately dark purple but on reaching 80° C. it becomes dark yellow-brown. The solution was cooled, removed from the glove box and filtered through an alumina plug eluting with methylene chloride. TLC of the deep yellow filtrate shows a bright green photoluminescent spot. Further purification on FLORISIL and then neutral alumina eluting with methylene chloride collected a bright yellow solution (with visible green photoluminescence in room light) which crystallized on addition of methanol and standing o/n. Final recrystallization from toluene by addition of methanol yielded ~0.24 g bright yellow crystals. The yellow solid was identified as the desired compound (wet with a little toluene and methanol) by 1-H nmr and then further purified by train sublimation prior to device evaluation.

TABLE 2

Solution Photoluminescence and Color

| Compound | Solution PL | Solution CIE x | Solution CIE y |
|---|---|---|---|
| control | 528.5 | 0.306 | 0.662 |
| G1 | 532 | 0.327 | 0.650 |
| G2 | 528.5 | 0.305 | 0.664 |
| G3 | 524.5 | 0.289 | 0.667 |
| G4 | 524 | 0.278 | 0.673 |
| G5 | 518.5 | 0.247 | 0.657 |
| G6 | 522.5 | 0.280 | 0.659 |
| G7 | 526 | 0.290 | 0.669 |
| G8 | 521.5 | 0.265 | 0.658 |
| G9 | 508 | 0.212 | 0.657 |
| G10 | 520 | 0.25 | 0.659 |
| G11 | 519 | 0.244 | 0.649 |
| G12 | 518 | 0.247 | 0.657 | control = 2-t-butyl-N,N,N',N'-tetra-p-tolyl-anthracene-9,10-diamine
PL = photoluminescence maximum, in nm
CIE x and y refer to the color coordinates according to the C.I.E. chromaticity scale (Commision Internationale de L'Eclairage, 1931)

Example 11

This example demonstrates the preparation of hole transport material HT1.

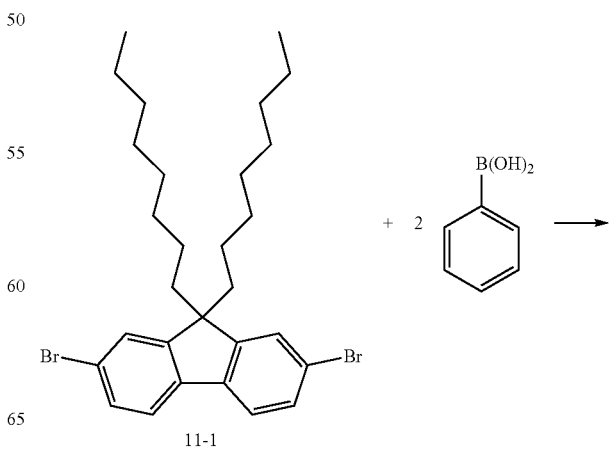

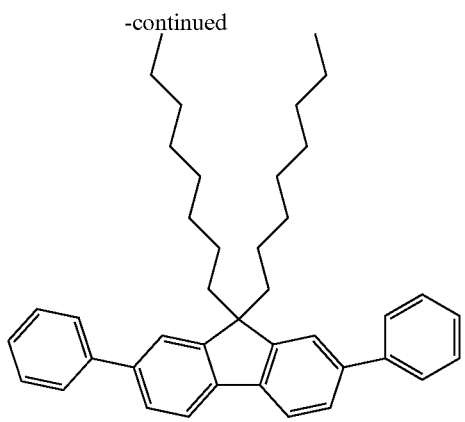

11-2

(a) Synthesis of compound 11-2 Under an atmosphere of nitrogen, a 250 mL round bottom was charged with 9,9-dioctyl-2,7-dibromofluorene (25.0 g, 45.58 mmol), phenylboronic acid (12.23 g, 100.28 mmol), Pd$_2$(dba)$_3$ (0.42 g, 0.46 mmol), P$^t$Bu$_3$ (0.22 g, 1.09 mmol) and 100 mL toluene. The reaction mixture stirred for five minutes after which KF (8.74 g, 150.43 mmol) was added in two portions and the resulting solution was stirred at room temperature overnight. The mixture was diluted with 500 mL THF and filtered through a plug of silica and celite and the volatiles were removed from the filtrate under reduced pressure. The yellow oil was purified by flash column chromatography on silica gel using hexanes as eluent. The product was obtained as a white solid in 80.0% yield (19.8 g). The structure was confirmed by 1-H nmr analysis.

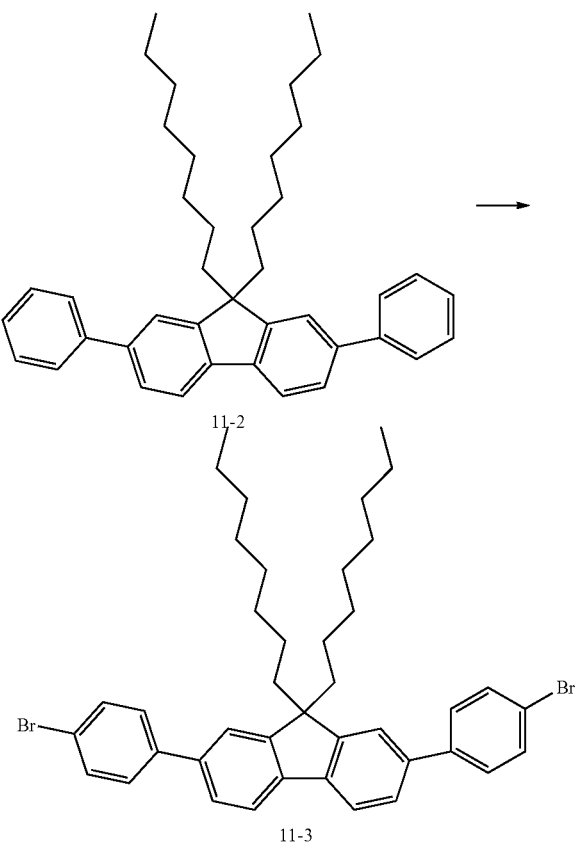

11-3

(b) Synthesis of compound 11-3
A 250 mL three-necked-round-bottom-flask, equipped with a condenser and dripping funnel was flushed with N$_2$ for 30 minutes. 9,9-dioctyl-2,7-diphenylfluorene (19.8 g, 36.48 mmol) (compound 11-2 above) was added and dissolved in 100 mL dichloromethane. The clear solution was cooled to −10° C. and a solution of bromine (12.24 g, 76.60 mmol) in 20 mL dichloromethane was added dropwise. The mixture was stirred for one hour at 0° C. and then allowed to warm to room temperature and stirred overnight. 100 mL of an aqueous 10% Na$_2$S$_2$O$_3$ solution was added and the reaction mixture was stirred for one hour. The organic layer was extracted and the water layer was washed three times with 100 mL dichloromethane. The combined organic layers were dried with Na$_2$SO$_4$ filtered and concentrated to dryness. Addition of acetone to the resulting oil gave a white precipitated. Upon filtration and drying a white powder was obtained (13.3 g, 52.2%). The structure was confirmed by 1-H nmr analysis.

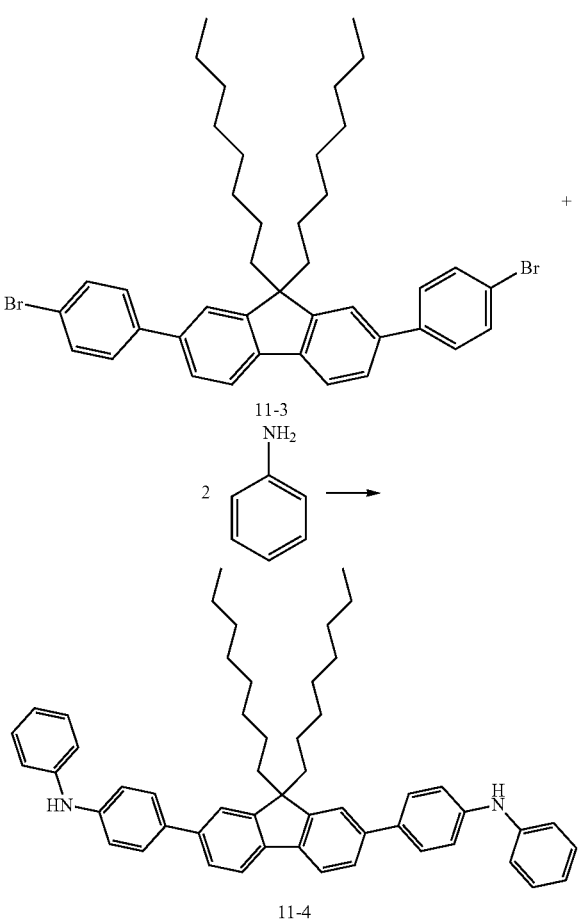

11-4

(c) Synthesis of compound 11-4
Under an atmosphere of nitrogen, a 250 mL round bottom was charged with compound 11-3 (13.1 g, 18.70 mmol), aniline (3.66 g, 39.27 mmol), Pd$_2$(dba)$_3$ (0.34 g, 0.37 mmol), P$^t$Bu$_3$ (0.15 g, 0.75 mmol) and 100 mL toluene. The reaction mixture stirred for 10 min after which NaO$^t$Bu (3.68 g, 38.33 mmol) was added and the reaction mixture was stirred at room temperature for one day. The resulting reaction mixture was diluted with 3 L toluene and filtered through a plug of silica and celite. Upon evaporation of volatiles, the dark brown oil obtained was purified by flash column chromatography on silica gel using a mixture of 1:10 ethyl acetate:hexanes as eluent. The product was obtained as a pale yellow powder in 50.2% yield (6.8 g). The structure was confirmed by 1-H nmr analysis.

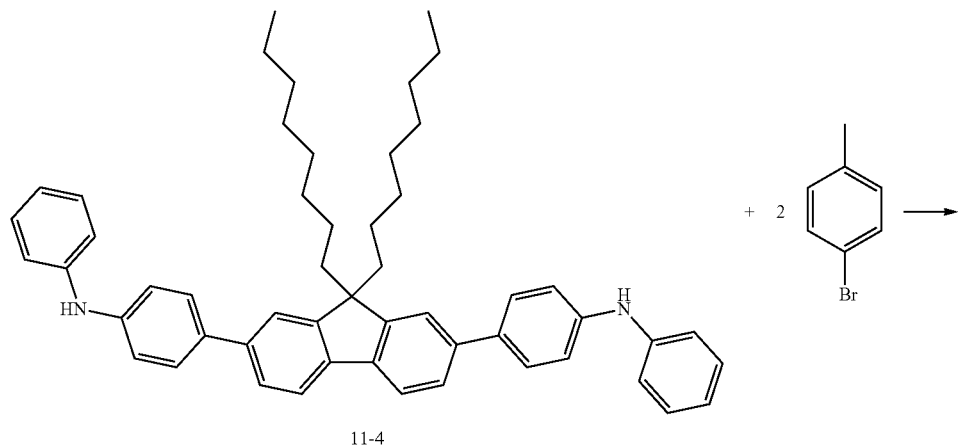

11-4

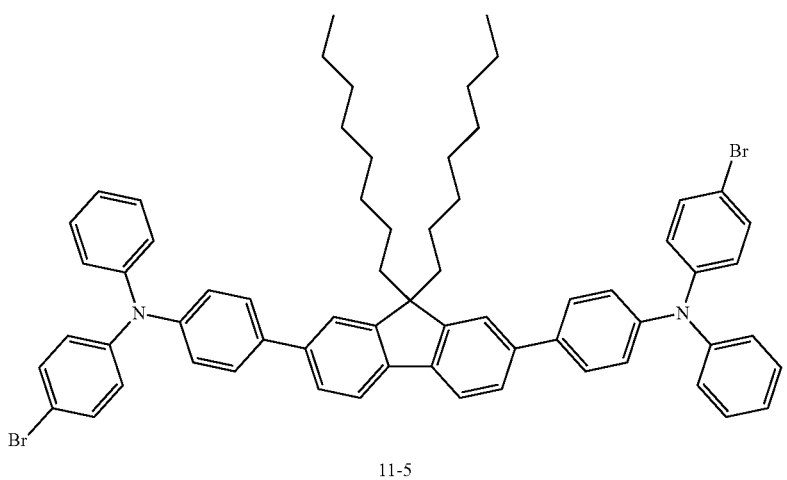

11-5

(d) Synthesis of compound 11-5 In a 250 mL three-necked-round-bottom-flask equipped with condenser, compound 11-4 (4.00 g, 5.52 mmol), 1-bromo-4-iodobenzene (4.68 g, 16.55 mmol), $Pd_2(dba)_3$ (0.30 g, 0.33 mmol) and DPPF (0.37 g, 0.66 mmol) were combined with 80 mL toluene. The resultant mixture was stirred for 10 min. NaO$^t$Bu (1.17 g, 12.14 mmol) was added and the mixture was heated to 80° C. for four days. The resulting reaction mixture was diluted with 1 L toluene and 1 L THF filtered through a plug of silica and celite to remove the insoluble salts. Upon evaporation of volatiles, the resulting brown oil was purified by flash column chromatography on silica gel using a mixture of 1:10 dichloromethane:hexanes as eluent. After drying a yellow powder was obtained (4.8 g, 84.8%). The structure was confirmed by 1-H nmr analysis.

(e) Synthesis of compound II-6

This compound was made according to the procedure published in Klaerner, G.; Lee, J.-I.; Lee, V. Y.; Chan, E.; Chen, J.-P.; Nelson, A.; Markiewicz, D.; Siemens, R.; Scott, J. C.; Miller, R. D., Chemistry of Materials (1999), 11(7), 1800-1805.

(f) Synthesis of HT1

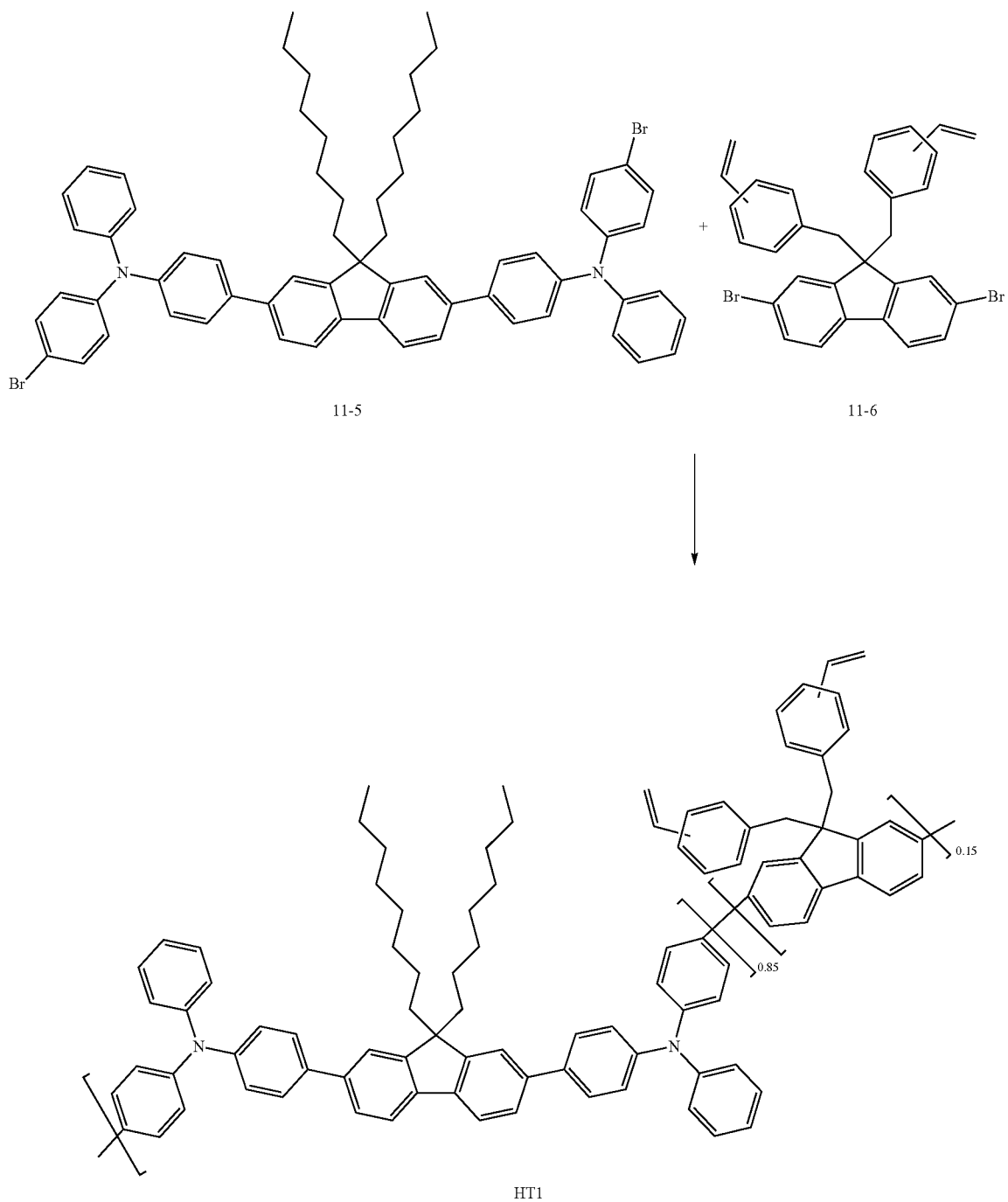

Bis(1,5-Cyclooctadiene)-nickel-(O) (0.556 g, 2.02 mmol) was added to a N,N-dimethylformamide (anhydrous, 4 mL) solution 2,2'-bipyridyl (0.0.315 g, 2.02 mmol) and 1,5-cyclooctadiene (0.219 g, 2.02 mmol). The resulting mixture was heated to 60° C. for 30 min. A toluene (anhydrous, 16 mL) solution of 2,7-dibromo-9,9'-(p-vinylbenzyl)-fluorene (0.0834 g, 0.15 mmol) and compound II-5 (0.88 g, 0.85 mmol), was then added rapidly to the stirring catalyst mixture. The mixture was stirred at 60° C. for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 80% yield (0.64 g). GPC (THF, room temperature): Mn=80,147; Mw=262,659; Mw/Mn=2.98.

Example 12

This example demonstrates the preparation of host material H1.

H1 was prepared according to the following scheme:

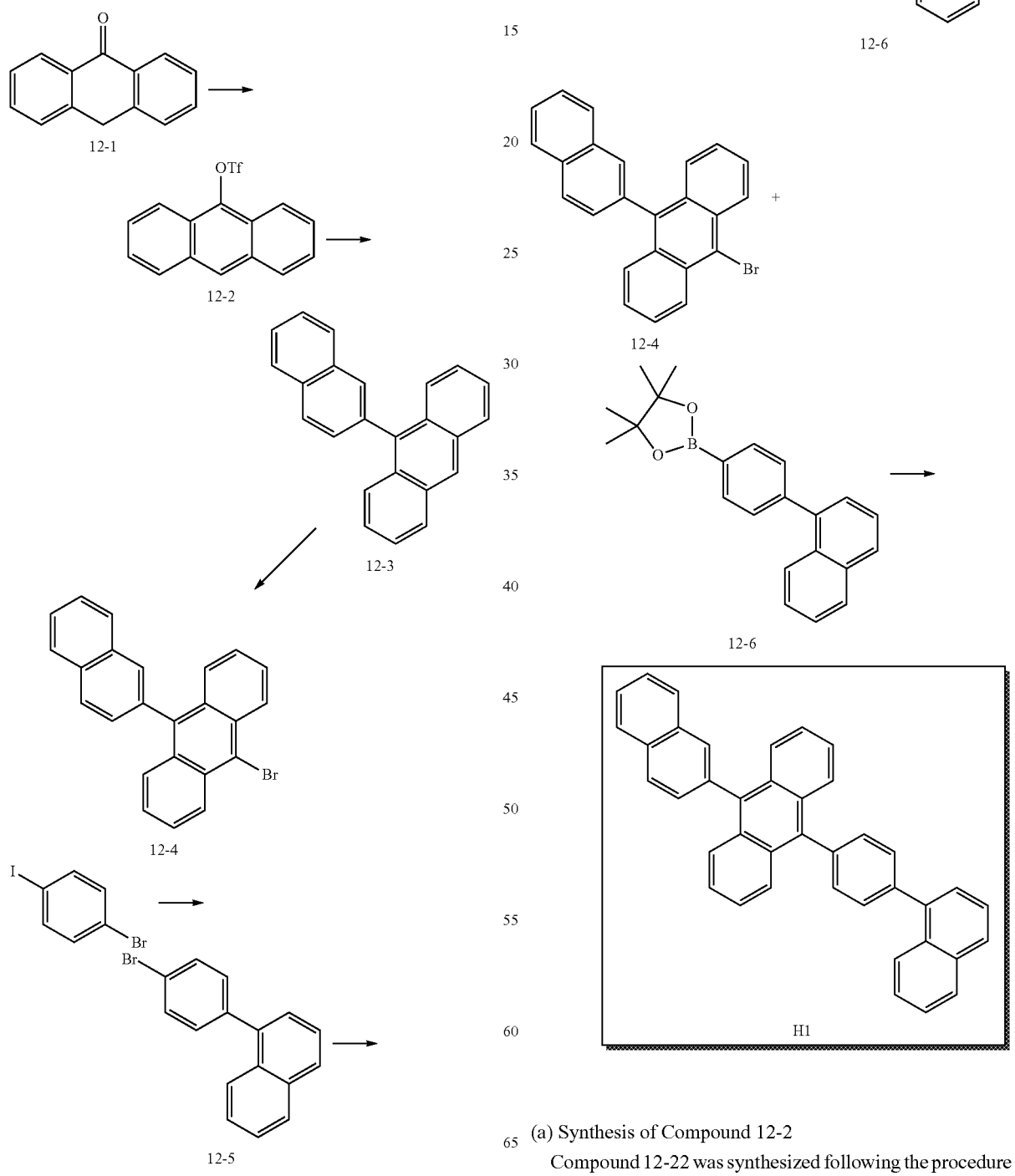

(a) Synthesis of Compound 12-2

Compound 12-22 was synthesized following the procedure in US application publication 2005/0245752.

(b) Synthesis of compound 12-3

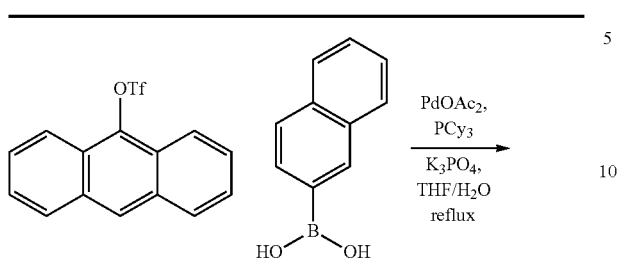

12-3

| Compound | Amount (g) | Amount (mol) | MW (g/mol) | Relative Equivalents |
| --- | --- | --- | --- | --- |
| anthracen-9-yl trifluoromethanesulfonate | 10.0 | 0.0306 | 326.29 | 1.00 |
| Napthalen-2-yl-boronic acid | 6.33 | 0.0368 | 171.99 | 1.20 |
| Potassium phosphate tribasic | 29.2 | 0.137 | 212.27 | 4.5 |
| Palladium(II) acetate | 0.687 | 0.00306 | 224.51 | 0.10 |
| tricyclohexylphosphine | 0.858 | 0.00306 | 280.43 | 0.10 |
| tetrahydrofuran | 75 mL | | | |
| Water | 45 mL | | 18.02 | |
| 9-(naphthalen-2-yl)anthracene | 9.31 (theoretical) | 0.0306 | 304.38 | 1.00 |

All solid reagents and THF were combined in a 200 mL Kjeldahl reaction flask equipped with a stir bar in a nitrogen-filled glove box. After removal from the dry box, the reaction mixture was purged with nitrogen and degassed water was added by syringe. A condensor was then added and the reaction was refluxed for 24 hours. TLC was performed indicating the absence of the anthracen-9-yl trifluoromethanesulfonate starting material. After cooling the organic layer was separated and the aqueous layer was extracted with DCM. The organic fractions were combined and the solvent was removed under reduced pressure. The resulting crude solid was purified by column chromatography using Aldrich neutral alumina and 5% DCM in hexanes. The solvent polarity was increased gradually to 50% DCM. Solvent removal gave 4.08 g of a white solid (43.8% yield). The product was confirmed by 1-H nmr analysis.

(c) Synthesis of compound 12-4

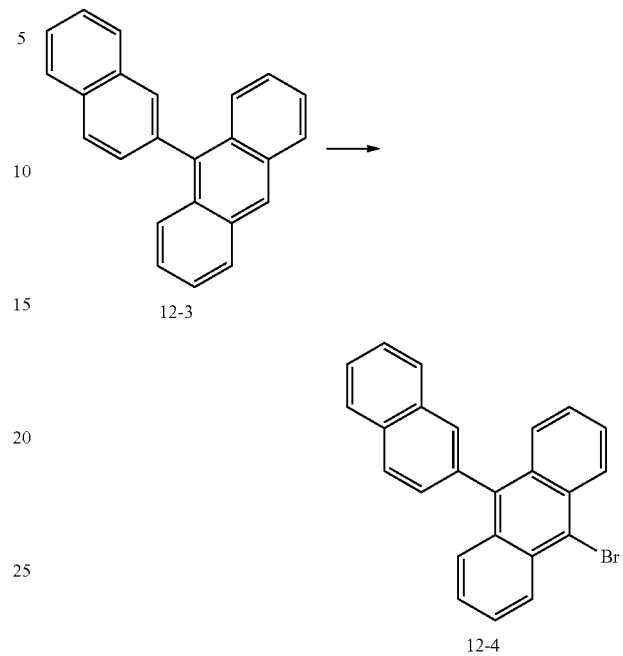

12-4

(d) Synthesis of compound 12-5

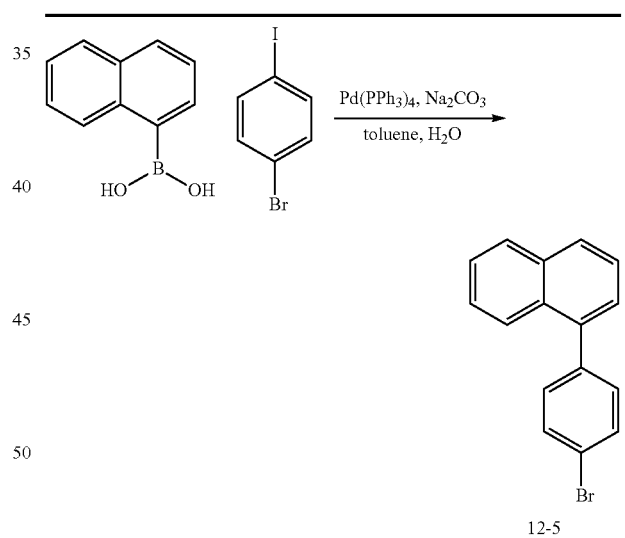

12-5

| Compound | Amount (g) | Amount (mol) | MW (g/mol) | Relative Equivalents |
| --- | --- | --- | --- | --- |
| napthalen-1-yl-1-boronic acid | 14.20 | 0.0826 | 171.99 | 1.00 |
| 1-bromo-4-iodobenzene | 25.8 | 0.0912 | 282.9 | 1.10 |
| Tetrakis(triphenylphosphine)palladium(0) | 1.2 | 0.00138 | 1155.56 | 0.0126 |
| sodium carbonate | 25.4 | 0.24 | 105.99 | 2.90 |
| toluene | 200 mL | | | |
| water | 120 mL | | | |
| 1-(4-bromophenyl)-naphthalene | 23.4 (theoretical) | 0.0826 | 283.16 | 1.00 |

All reagents and toluene were combined in a 500 mL round bottom flask equipped with a stir bar in a nitrogen-filled glove box. After removal from the dry box, the reaction mixture was purged with nitrogen and degassed water was added by syringe. A condenser was equipped and the reaction was refluxed for 15 hours. TLC was performed indicating the reaction was complete. The reaction mixture was cooled to room temperature. The organic layer was separated and the aqueous layer was extracted with DCM. The organic fractions were combined and the solvent was removed under reduced pressure to give a viscous oil. The crude material was purified by column chromatography using silica gel and 10% DCM/Hexanes. Solvent removal gave 20 grams (85% yield) of a clear, viscous oil. The product was confirmed by 1-H nmr analysis.

(e) Synthesis of compound 12-6

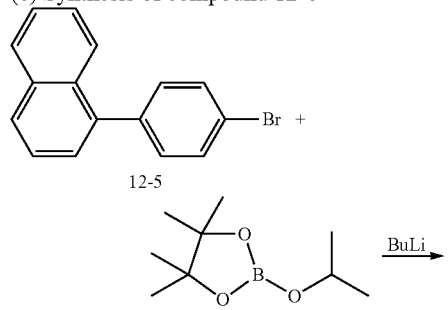

To a solution of 1-(4-bromo-phenyl)-naphthalene (40 g) dissolved in anhydrous THF (800 mL), was added slowly of nBuLi (1.6 M in hexane, 130 mL) at −78° C. (dry ice/acetone). The reaction mixture turned brown and was stirred for 10 min at −78° C. then warmed up, stirred for further 10 min and then cooled back down to −78° C. To this was added dioxaborolane (42.8 mL) and the reaction stirred at this temperature for 0.5 h before warming to room temperature and stirring for 1 hour. Water was then added to the reaction mixture which was thoroughly, extracted with $Et_2O$. The organic layers were dried over anhydrous magnesium sulfate and filtered. The solvents were removed under vacuum and water was added into this concentrated solution, a white solid was formed and filtered. The crude product was recrystallized in toluene, dried under vacuum to yield 25 g of 12-6 as a white solid.

(f) Synthesis of H1

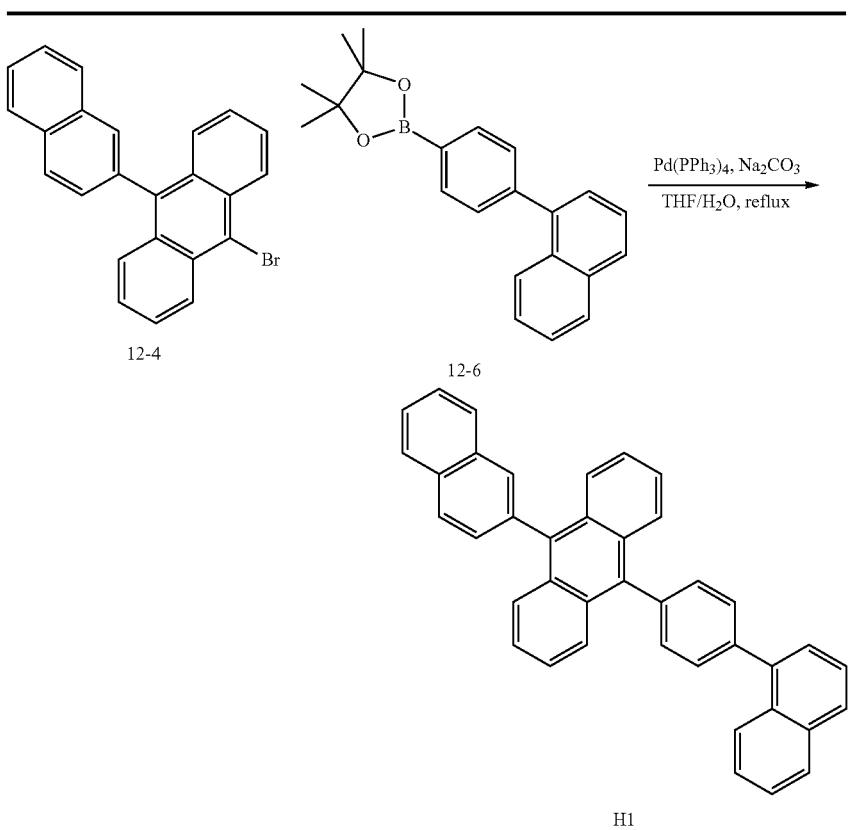

| Compound | Amount (g) | Amount (mol) | MW (g/mol) | Relative Equivalents |
|---|---|---|---|---|
| 10-bromo-9-(naphthalen-7-yl)anthracene | 1.00 | 0.00261 | 383.28 | 1.00 |

| -continued | | | | |
|---|---|---|---|---|
| 4,4,5,5-tetramethyl-2-(4-(naphthalen-4-yl)phenyl)-1,3,2-dioxaborolane | 0.95 | 0.0029 | 330.23 | 1.10 |
| Tetrakis-triphenylphosphine palladium(0) | 0.15 | 0.00013 | 1155.56 | 0.05 |
| Sodium carbonate | 5.3 | 0.050 | 105.99 | |
| THF | 25 mL | | | |
| Water | 25 mL | | | |
| 10-(4-(naphthalen-1-yl)phenyl)-9-(naphthalen-7-yl)anthracene | 1.32 (theoretical) | | 506.63 | |

All reagents and THF were combined in a 100 mL round bottom flask equipped with a stir bar in a nitrogen-filled glove box. After removal from the dry box, the reaction mixture was purged with nitrogen and degassed water was added by syringe. A condenser was equipped and the reaction was refluxed for 72 hours. LC-MS was performed indicating the reaction was complete. The reaction mixture was cooled to room temperature. The organic layer was separated and the aqueous layer was extracted with DCM. The organic fractions were combined and the solvent was removed under reduced pressure to give a grey solid. The crude material was purified by column chromatography using silica gel and DCM/Hexanes. Solvent removal gave 1 gram (76% yield) as a white solid. Host H1 was purified using both solution and vapor sublimation techniques.

Example 13

This example illustrates the preparation of host H2.

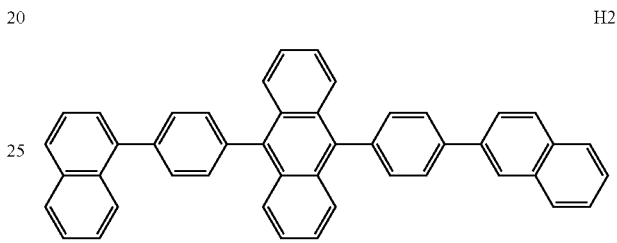

H2

Host material H2 was synthesized in an analogous manner to H1 following the Scheme below.

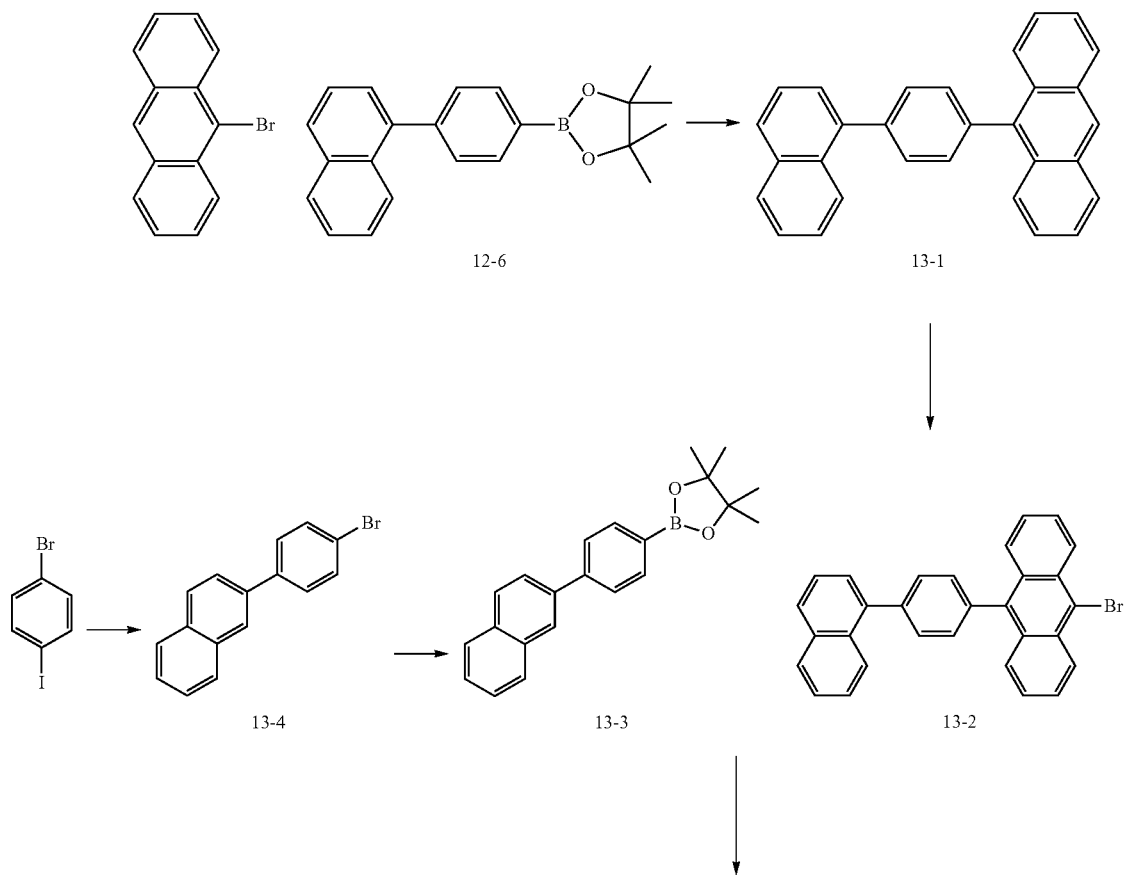

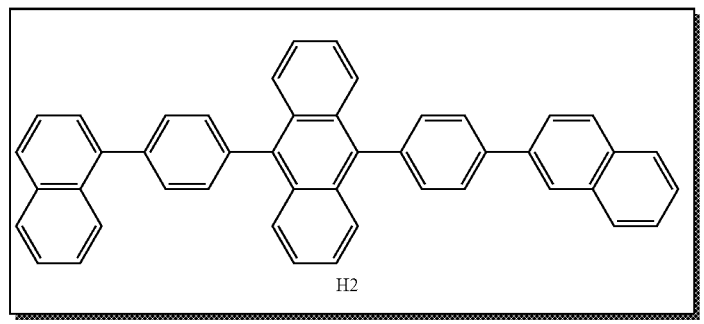

(a) Synthesis of compound 13-1

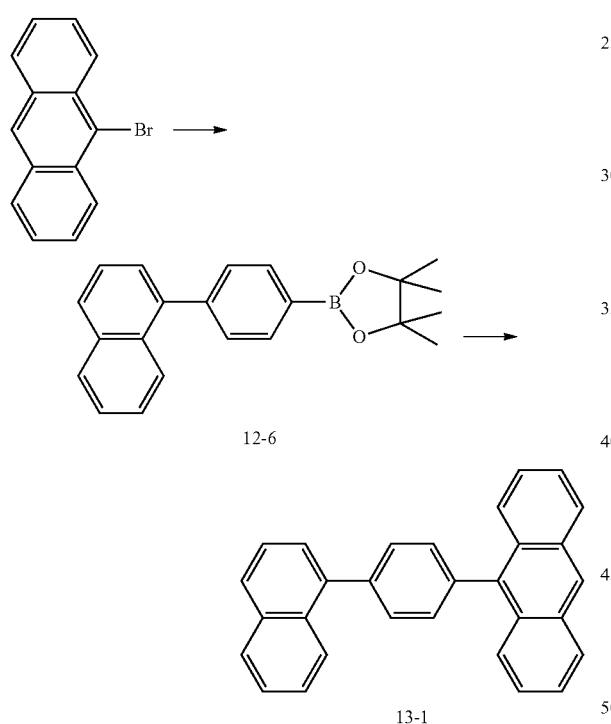

To a mixture of 4,4,5,5-tetramethyl-2-(4-naphthalen-1-yl-phenyl[1,3,2]dioxaborolane (20.7 g) and 9-bromo-anthracene (14.6 g) in toluene (300 ml) was added 2M sodium carbonate (12.1 g dissolved in 57 ml of water) followed by the addition of phase-transfer agent Aliquat336 (2.4 g). The mixture was bubbled with nitrogen for 15 min before addition of tetrakis(triphenylphosphine)palladium(0) (Pd[(C$_6$H$_5$)$_3$P]$_4$, (0.69 g) and the reaction was heated at 90° C. (oil bath) for one day under a nitrogen atmosphere. The reaction mixture was then cooled to room temperature, extracted with ethyl ether. The organic solvent was removed under vacuum and the crude product was washed with hexane, purified by a short column of FLORISIL using hexane:THF (1:1.5) as an eluent. To yield 17 g of the desired compound as a white solid.

(b) Synthesis of compound 13-2

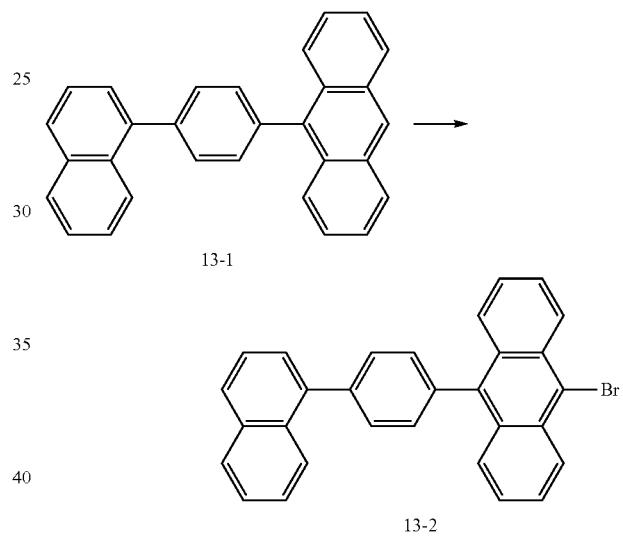

9-(4-naphthalen-1-yl-phenyl)anthracene (15 g, 40 mmol) was dissolved into methylene chloride (500 ml) in a 3-necks round bottom flask and bromine (7 g, d 3.12 g/ml, FW 159.81, 44 mmol) was added slowly via a dropping funnel over a period of 1 hour. The reaction mixture is then sparged with nitrogen to remove HBr and the reaction stirred overnight at room temperature. The reaction mixture was then extracted with water, dried over MgSO$_4$, and filtered over FLORISIL. The solvent was removed under vacuum and a yellow solid was collected which on washing with hexane and drying yielded 16 g of yellow solid as the desired compound.

(c) Synthesis of compound H2

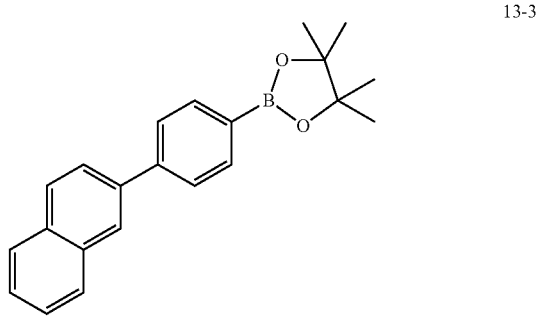

13-3

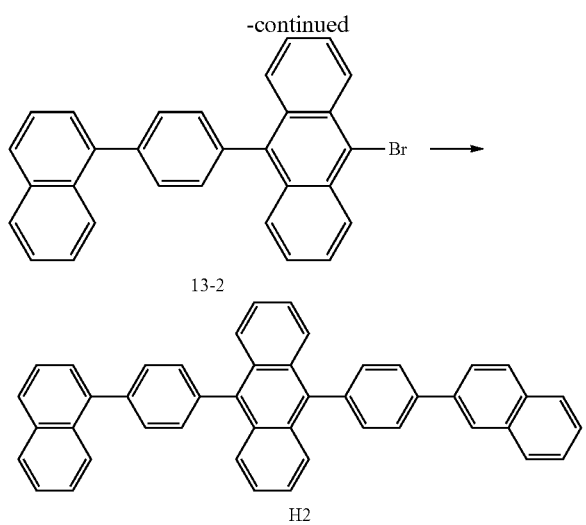

To a mixture of 4,4,5,5-tetramethyl-2-(4-naphthalen-2-yl-phenyl)-[1,3,2]dioxaborolane (12.6 g) and 9-bromo-10-(4-naphthalen-1-yl-phenyl)-anthracene (16 g) in toluene (300 ml) was added 2M sodium carbonate (7.4 g dissolved in 35 ml of water) followed by the addition of phase-transfer agent Aliquat336 (1.4 g). The mixture was bubbled with nitrogen for 15 min before addition of tetrakis(triphenylphosphine)palladium(0) (Pd[(C$_6$H$_5$)$_3$P]$_4$, (0.40 g) and the reaction was heated at 90° C. (oil bath) for one day under a nitrogen atmosphere. The reaction mixture was then cooled to room temperature, extracted with ethyl ether, dried over MgSO$_4$, filtered and added into methanol, filtered and the yellow solid so collected dried under vacuum. The yellow solid was dissolved in THF, passed through FLOROSIL column with THF/hexane (1:1), concentrated under vacuum to yield 10 g light yellow solid which was purified by 3-zone (250 C, 210 C, 170 C) sublimation for 70 hours. 5.6 g pale yellow solid was recovered.

Examples 14-27

These examples demonstrate the fabrication and performance of organic electronic devices having green emission.
Device Fabrication and Testing
The devices were constructed as follows:
Indium Tin Oxide (ITO): 100 nm
buffer layer=Buffer 1 (25 nm), which is an aqueous dispersion of polypyrrole and a polymeric fluorinated sulfonic acid. The material was prepared using a procedure similar to that described in Example 1 of published U.S. patent application no. 2005/0205860.
hole transport layer=polymer HT1 (20 nm)
photoactive layer=13:1 host:dopant (48 nm)
electron transport (ET) layer=(20 nm)
cathode=LiF/Al (0.5/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of a hole transport material, and then heated to remove solvent. After cooling the substrates were spin-coated with the emissive layer solution, and heated to remove solvent. The substrates were masked and placed in a vacuum chamber. An electron transport layer was deposited by thermal evaporation, followed by a layer of LiF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W.

The materials used (host, dopant, and ET material) are given in Table 3. The device results are given in Table 4. For comparison, a control dopant was used.
control dopant=2-t-butyl-N,N,N',N'-tetra-p-tolyl-anthracene-9,10-diamine
AlQ=tris(8-hydroxyquinolato)aluminum
ZrQ=tetrakis(8-hydroxyquinolato)zirconium

TABLE 3

Device Materials

| Example | Dopant | Host | ET |
|---|---|---|---|
| control | control dopant | H1 | AlQ |
| 14 | G1 | H1 | AlQ |
| 15 | G2 | H1 | ZrQ |
| 16 | G3 | H1 | ZrQ |
| 17 | G4 | H1 | ZrQ |
| 18 | G4 | H2 | ZrQ |
| 19 | G4:G5 (1:1) | H2 | ZrQ |
| 20 | G6 | H2 | ZrQ |
| 21 | G7 | H2 | ZrQ |
| 22 | G7:G8 (1:1) | H2 | ZrQ |
| 23 | G8 | H2 | ZrQ |
| 24 | G9 | H2 | ZrQ |
| 25 | G10 | H2 | ZrQ |
| 26 | G11 | H2 | ZrQ |
| 27 | G12 | H2 | ZrQ |

TABLE 4

Device Results

| Example | CE [cd/A] | Voltage (V) | Lum. ½ Life [h] | EL peak | EL CIE x | EL CIE y |
|---|---|---|---|---|---|---|
| Control | 15.2 | 4.3 | 135,000 | 530 | 0.310 | 0.644 |
| 14 | 13.5 | 4.3 | 143,000 | 532 | 0.314 | 0.640 |
| 15 | 20.8 | 4.3 | 132,000 | 528 | 0.294 | 0.651 |
| 16 | 22.8 | 4.3 | 140,000 | 525.5 | 0.288 | 0.648 |
| 17 | 23.2 | 4.3 | 126,000 | 524 | 0.275 | 0.652 |
| 18 | 22.5 | 4.2 | 171,000 | 524 | 0.280 | 0.653 |
| 19 | 21.4 | 4.6 | 120,000 | 524 | 0.291 | 0.647 |
| 20 | 20.7 | 4.3 | 36,500 | 524.5 | 0.290 | 0.635 |
| 21 | 19.9 | 4.2 | 106,000 | 526 | 0.287 | 0.651 |

TABLE 4-continued

| | | | Device Results | | | |
|---|---|---|---|---|---|---|
| Example | CE [cd/A] | Voltage (V) | Lum. ½ Life [h] | EL peak | EL CIE x | EL CIE y |
| 22 | 23.8 | 4.2 | 223,000 | 527 | 0.291 | 0.651 |
| 23 | 21.5 | 4.5 | 165,000 | 527.7 | 0.293 | 0.648 |
| 24 | 12.3 | 4.6 | 10,700 | 515 | 0.252 | 0.621 |
| 25 | 19.3 | 4.3 | 250,000 | 526 | 0.299 | 0.646 |
| 26 | 17.7 | 4.3 | 14,000 | 528 | 0.291 | 0.645 |
| 27 | 17.2 | 4.3 | 205,000 | 528 | 0.295 | 0.645 |

* All data @ 1000 nits, CE = current efficiency; Lum. ½ Life = time to reach ½ of initial luminance, in hours; CIE x and y refer to the color coordinates according to the C.I.E. chromaticity scale (Commision Internationale de L'Eclairage, 1931)

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

What is claimed is:

1. An organic electronic device comprising a first electrical contact, a second electrical contact and a photoactive layer therebetween, the photoactive layer comprising a green luminescent material having Formula II, or a mixture of compounds having Formula I and Formula II

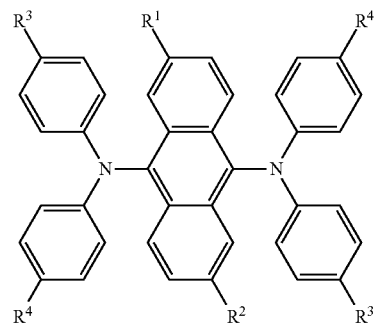

Formula I wherein:
$R^1$ and $R^2$ are the same or different and are selected from the group consisting of hydrogen, alkoxy, tertiary alkyl, and cycloalkyl,
$R^3$ and $R^4$ are the same or different and are selected from the group consisting of fluorine, aryl, and alkyl,

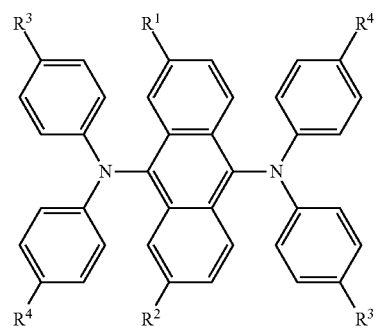

Formula II wherein:
$R^1$ and $R^2$ are the same or different and are selected from the group consisting of alkoxy, tertiary alkyl, and cycloalkyl,
$R^3$ and $R^4$ are the same or different and are selected from the group consisting of fluorine, aryl, and alkyl.

2. The device of claim 1, wherein, in Formula I, at least one of $R^1$ and $R^2$ is not hydrogen.

3. The device of claim 1, wherein at least one of $R^1$ and $R^2$ is an alkoxy group selected from the group consisting of methoxy and ethoxy.

4. The device of claim 1, wherein at least one of $R^1$ and $R^2$ is a tertiary alkyl group selected from the group consisting of t-butyl and neopentyl.

5. The device of claim 1, wherein at least one of $R^1$ and $R^2$ is a cycloalkyl selected from the group consisting of cyclohexyl, 1-methylcyclohexyl, and 1-adamantyl.

6. The device of claim 1, wherein the luminescent material of Formula I and II are selected from the group consisting of compounds G1 through G12, for the respective Formula:

| Compound | Formula | $R^1$ | $R^2$ | $R^3$ | $R^4$ |
|---|---|---|---|---|---|
| G1 | I | H | H | i-propyl | t-butyl |
| G2 | I | t-butyl | H | i-propyl | t-butyl |
| G3 | I | t-butyl | t-butyl | i-propyl | t-butyl |

-continued

| Compound | Formula | R¹ | R² | R³ | R⁴ |
|---|---|---|---|---|---|
| G4 | I | 1-methylcyclohexyl | 1-methylcyclohexyl | i-propyl | t-butyl |
| G5 | II | 1-methylcyclohexyl | 1-methylcyclohexyl | i-propyl | t-butyl |
| G6 | I | methoxy | methoxy | i-propyl | t-butyl |
| G7 | I | 1-adamantyl | 1-adamantyl | i-propyl | t-butyl |
| G8 | II | 1-adamantyl | 1-adamantyl | i-propyl | t-butyl |
| G9 | I | t-butyl | t-butyl | F | F |
| G10 | I | 1-adamantyl | 1-adamantyl | phenyl | phenyl |
| G11 | I | 1-adamantyl | 1-adamantyl | t-butyl | 3-biphenyl |
| G12 | I | 1-adamantyl | 1-adamantyl | t-butyl | phenyl. |

7. The device of claim 1, wherein the photoactive layer further comprises a host material.

8. The device of claim 7 wherein the host material comprises at least one diarylanthracene.

9. The device of claim 8 wherein the diarylanthracene has the formula:

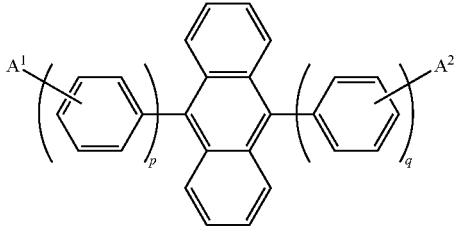

where:
$A^1$ and $A^2$ are the same or different at each occurrence and are selected from the group consisting of H, an aromatic group, and an alkenyl group, or A may represent one or more fused aromatic rings;

p and q are the same or different and are an integer from 1-3.

10. The device of claim 9 wherein at least one of $A^1$ and $A^2$ comprises a naphthyl group.

11. The device of claim 10 wherein the host is selected from the group consisting of

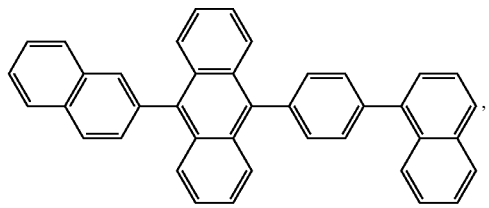

H1

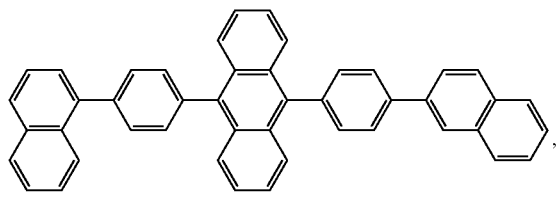

H2 and combinations thereof.

12. The device of claim 1, wherein $R^1$ and $R^2$ are the same.

13. The device of claim 1, wherein the compounds having Formula I and Formula II are isomers.

* * * * *